US009854692B2

(12) United States Patent  
Yoo

(10) Patent No.: US 9,854,692 B2  
(45) Date of Patent: Dec. 26, 2017

(54) PROTECTIVE COVER FOR ELECTRONIC DEVICE

(71) Applicant: Samsung Electronics Co., Ltd., Gyeonggi-do (KR)

(72) Inventor: Jung-Heon Yoo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 110 days.

(21) Appl. No.: 14/568,909

(22) Filed: Dec. 12, 2014

(65) Prior Publication Data

US 2015/0173221 A1    Jun. 18, 2015

(30) Foreign Application Priority Data

Dec. 13, 2013  (KR) .................. 10-2013-0155699  
Dec. 3, 2014   (KR) .................. 10-2014-0172275

(51) Int. Cl.  
*A47B 97/04*     (2006.01)  
*H05K 5/02*      (2006.01)  
(Continued)

(52) U.S. Cl.  
CPC ......... *H05K 5/0234* (2013.01); *G06F 1/1626* (2013.01); *H05K 5/03* (2013.01);  
(Continued)

(58) Field of Classification Search  
CPC ........ A47B 23/042; A47B 97/08; A47G 1/141  
(Continued)

(56) References Cited

U.S. PATENT DOCUMENTS 3,305,205 A  *  2/1967  Frankl ................... A47G 1/141  
                                                                                       206/45.2  
7,828,260 B2 *  11/2010 Hauser ................. A47B 23/043  
                                                                                       248/447  
(Continued)

FOREIGN PATENT DOCUMENTS

CN        203027316      6/2013  
GB        2 496 109       5/2013  
(Continued)

OTHER PUBLICATIONS

European Search Report dated May 28, 2015 issued in counterpart application No. 14197448.5-1953.

(Continued)

*Primary Examiner* — Terrell McKinnon  
*Assistant Examiner* — Michael McDuffie  
(74) *Attorney, Agent, or Firm* — The Farrell Law Firm, P.C.

(57) ABSTRACT

A protective cover is provided that protects an electronic device. The protective cover includes a front cover having a front surface and a rear surface. The rear surface of the front cover is disposed over a front surface of the electronic device when the protective cover is closed. The protective cover also includes a rear cover connected with the front cover and having a front surface and a rear surface. The rear surface of the rear cover is disposed on a rear surface of the electronic device. The protective cover further includes a plurality of foldable segments disposed on the rear surface of the front cover. The plurality of foldable segments are unfolded for use as a stand of the protective cover and are folded for storage within the rear surface of the front cover.

6 Claims, 23 Drawing Sheets

(51) Int. Cl.
*H05K 5/03* (2006.01)
*G06F 1/16* (2006.01)

(52) U.S. Cl.
CPC .............. *G06F 2200/1633* (2013.01); *G06F 2200/1634* (2013.01)

(58) Field of Classification Search
USPC .... 248/460, 450, 457, 459, 441.1, 447, 454, 248/463, 174, 300, 444, 455; 206/45.23, 206/307, 307.1, 308.3, 312; 40/752, 754, 40/777
See application file for complete search history.

(56) References Cited

U.S. PATENT DOCUMENTS

| | | | | |
|---|---|---|---|---|
| 8,282,065 | B1* | 10/2012 | Stone | A47B 23/044 16/221 |
| 8,714,351 | B2* | 5/2014 | Toulotte | A45C 11/00 206/320 |
| 8,720,843 | B1* | 5/2014 | Chen | G06F 1/1613 206/305 |
| 8,919,544 | B2* | 12/2014 | Lee | G06F 1/1626 206/320 |
| 2003/0213886 | A1* | 11/2003 | Gilbert | A47B 23/044 248/454 |
| 2006/0007645 | A1* | 1/2006 | Chen | G06F 1/1626 361/679.04 |
| 2007/0001079 | A1* | 1/2007 | Patterson | A45C 11/00 248/309.1 |
| 2008/0073475 | A1* | 3/2008 | Gartrell | B42F 13/40 248/460 |
| 2012/0153116 | A1 | 6/2012 | Harrison | |
| 2012/0168577 | A1 | 7/2012 | Cheng | |
| 2012/0312953 | A1* | 12/2012 | Moffa | A47B 23/044 248/459 |
| 2013/0083465 | A1* | 4/2013 | Motoishi | G06F 1/1613 361/679.21 |
| 2013/0140194 | A1* | 6/2013 | Han | G06F 1/1656 206/45.23 |
| 2013/0165190 | A1 | 6/2013 | Ko et al. | |
| 2013/0178155 | A1 | 7/2013 | Shulenberger | |
| 2013/0178161 | A1 | 7/2013 | Shulenberger | |
| 2013/0223005 | A1 | 8/2013 | Smith et al. | |
| 2013/0233732 | A1 | 9/2013 | Hsu | |
| 2013/0264459 | A1 | 10/2013 | McCosh et al. | |
| 2013/0277271 | A1 | 10/2013 | Toulotte | |
| 2013/0284614 | A1* | 10/2013 | Lee | G06F 1/1626 206/45.2 |
| 2015/0122850 | A1* | 5/2015 | Quehl | A45C 11/00 224/191 |
| 2015/0191273 | A1* | 7/2015 | Melmon | G06F 1/16 206/45.23 |

FOREIGN PATENT DOCUMENTS

| | | |
|---|---|---|
| JP | 2013-146386 | 8/2013 |
| KR | 20-2011001198 | 12/2011 |
| KR | 1020120037308 | 4/2012 |
| KR | 1020120135978 | 12/2012 |
| KR | 20-0467317 | 6/2013 |
| WO | WO 2013/043465 | 3/2013 |

OTHER PUBLICATIONS

International Search Report dated Feb. 26, 2015 issued in counterpart application No. PCT/KR2014/012278.
Chinese Office Action dated Nov. 23, 2016 issued in counterpart application No. 201480068352.9, 23 pages.

\* cited by examiner

PROTECTIVE COVER FOR ELECTRONIC DEVICE

PRIORITY

This application claims priority under 35 U.S.C. §119(a) to Korean Application Serial No. 10-2013-0155699, which was filed in the Korean Intellectual Property Office on Dec. 13, 2013, and to Korean Application Serial No. 10-2014-0172275, which was filed in the Korean Intellectual Property Office on Dec. 3, 2014, the contents of which are incorporated herein by reference.

BACKGROUND OF THE INVENTION

1. Field of the Invention

The present invention relates generally to a protective cover for an electronic device, and more particularly, to a protective cover that provides a typing and standing-view cradle for an electronic device.

2. Description of the Related Art

Electronic devices such as, for example, a portable phone, an MP3 player, a portable multimedia player (PMP), a tablet personal computer (PC), and an e-book terminal, enable users to access various contents.

A user may perform wireless communication with a counterpart electronic device using a portable electronic device. The portable electronic device may be provided with a display unit, an antenna device, an input/output ("I/O") device, and a data transceiver.

Besides original functions, portable electronic devices are also provided with various other functions such as, for example, reproduction of music and video images, a game function, a camera function, a schedule management function, and a dictionary function. Furthermore, the portable electronic devices also provide an information retrieval function and a new application adding function.

In addition, due to the development of smaller and lighter portable electronic devices, users may use a portable electronic device while holding the portable electronic device or traveling with the portable electronic device in a pocket or a bag. However, since there is always a danger of loss or damage of such a portable electronic device, the portable electronic device is used while mounted in a separate protective cover so as protect the portable electronic device.

The protective cover may also serve as a cradle that is adapted to be opened/closed using a magnet provided in the protective cover. The cradle and magnet allow the user to maintain the portable electronic device at various angles.

That is, when the portable electronic device is used in a typing mode or a standing-view mode, the protective cover is used to form a typing cradle or a standing-view cradle using the magnet.

However, the magnet provided in the protective cover affects a magnetic field sensor and an antenna provided in the portable electronic device, and performance of the magnetic field sensor and the antenna may be degraded.

In addition, since the protective cover is configured to form a typing cradle or a standing-view cradle using only the magnet, the cradle may be easily separated or laid down when external pressure is applied.

SUMMARY OF THE INVENTION

The present invention has been made to address at least the above problems and/or disadvantages and to provide at least the advantages described below. Accordingly, an aspect of the present invention provides a device, which allows a protective cover to be used as a typing cradle or a standing-view cradle without a magnet and is capable of improving the support force of the typing cradle or the standing-view cradle.

According to an embodiment of the present invention, a protective cover is provided that protects an electronic device. The protective cover includes a front cover having a front surface and a rear surface. The rear surface of the front cover is disposed over a front surface of the electronic device when the protective cover is closed. The protective cover also includes a rear cover connected with the front cover and having a front surface and a rear surface. The rear surface of the rear cover is disposed on a rear surface of the electronic device. The protective cover further includes a plurality of foldable segments disposed on the rear surface of the front cover. The plurality of foldable segments are unfolded for use as a stand of the protective cover and are folded for storage within the rear surface of the front cover.

According to another embodiment of the present invention, a protective cover is provided that protects an electronic device. The protective cover includes a front cover having a front surface and a rear surface. The rear surface of the front cover is disposed over a front surface of the electronic device when the protective cover is closed. The protective cover also includes a rear cover connected with the front cover and having a front surface and a rear surface. The rear surface of the rear cover is disposed on a rear surface of the electronic device. The protective cover additionally includes a first recess provided in the rear surface of the front cover, and a plurality of foldable segments. The plurality of foldable segments are unfolded for use as a stand of the protective cover when an end of at least one of the plurality of foldable segments is supported by a catching portion formed in the first recess. The plurality of foldable segments are folded for storage within the rear surface of the front cover when the plurality of foldable segments are not used as the stand.

According to a further embodiment of the present invention, a protective cover is provided that protects an electronic device. The protective cover includes a front cover having a front surface and a rear surface. The rear surface of the front cover is positioned over a front surface of the electronic device when the protective cover is closed. The protective cover also includes a rear cover connected with the front cover and having a front surface and a rear surface. The rear surface of the front cover is disposed on a rear surface of the electronic device. The protective cover additionally includes a stand segment disposed on the rear surface of the front cover. The stand segment is rotated to be folded or unfolded to be used as a stand of the protective cover or to be disposed within the rear surface of the front cover. The protective cover further includes an attaching unit provided on the stand segment to be engaged with or disengaged from a locking unit formed in the rear cover. The attaching unit is engaged with the locking unit to allow the stand segment to be used as the stand of the protective cover or the attaching unit is disengaged from the locking unit to allow the stand segment to be disposed within the front cover.

According to a further embodiment of the present invention, a protective cover is provided that includes a front cover having a first recess and a plurality of segments capable of being disposed in the first recess. The protective cover also includes a rear cover connected with the front cover. When the plurality of segments are configured so that a surface of one of the plurality of segments directly contacts an inner surface of the first recess and surfaces of remaining segments of the plurality of segments are separated from the first recess, the protective cover is used as a viewing stand. When surfaces of each of the plurality of segments are separated from the inner surface of the recess and an end of the one of the plurality of segments is supported by a catching portion formed in the first recess, the protective cover is used as a typing stand. The plurality of segments are accommodated in the first recess when the protective cover is not used as the viewing stand or the typing stand.

BRIEF DESCRIPTION OF THE DRAWINGS

The above and other aspects, features, and advantages of the present invention will be more apparent from the following detailed description when taken in conjunction with the accompanying drawings, in which.

DETAILED DESCRIPTION OF EMBODIMENTS OF THE PRESENT INVENTION

Figure 1:
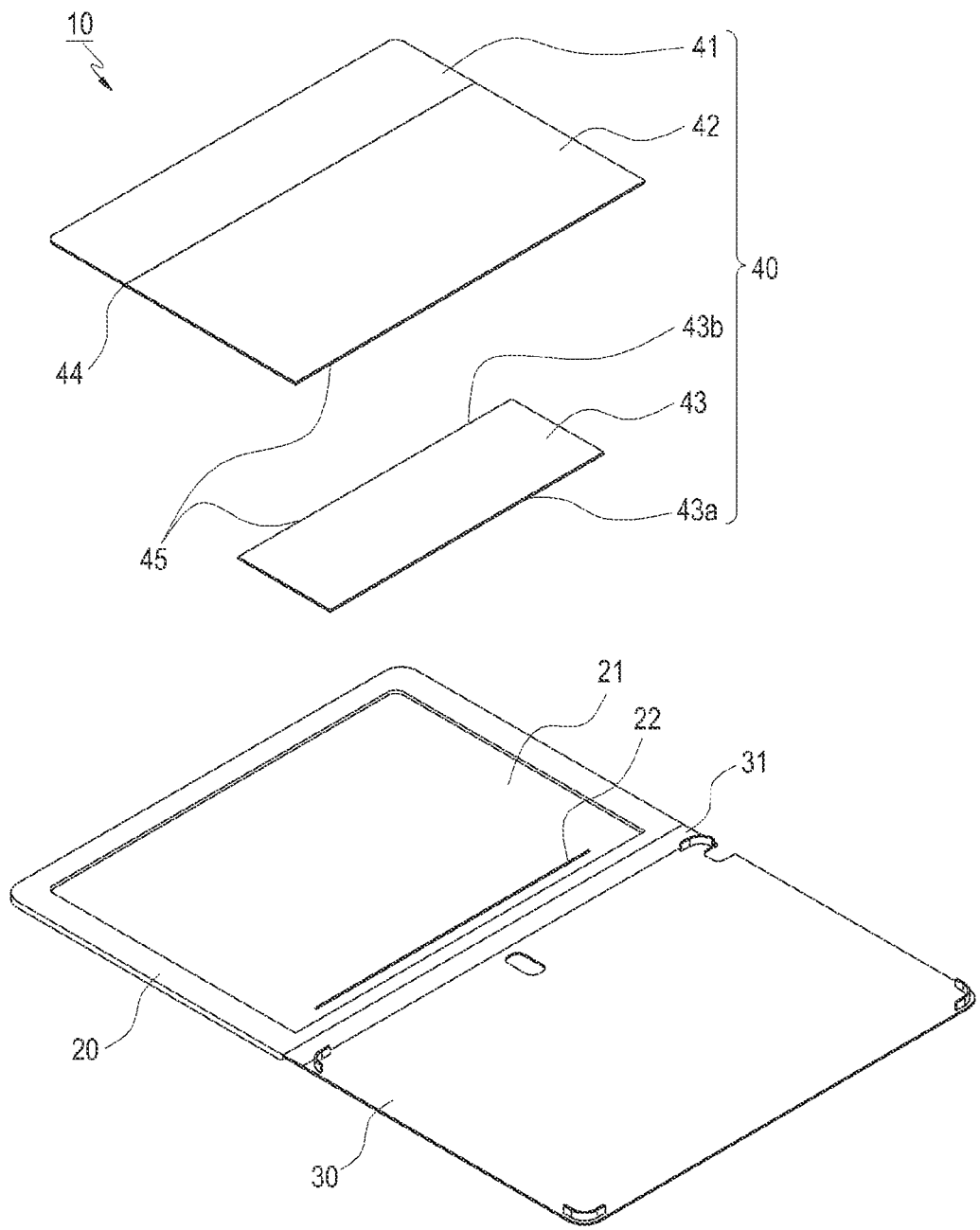
FIG. 1 is a diagram illustrating an exploded perspective view of a protective cover, according to an embodiment of the present invention.

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

General terms used herein, which are currently and widely used, are selected in consideration of functions of structural elements in embodiments of the present invention. However, meanings of the terms may be changed according to an intention of an inventor, a judicial precedent, appearance of a new technology, and the like. In addition, an arbitrarily selected term may be used. In such a case, the meaning of the term will be described in detail at the corresponding part in the description. Thus, the terms used in various embodiments of the present invention should be defined based on the meanings of the terms and the overall contents of the embodiments of the present invention instead of simple titles of the terms.

The electronic apparatus, according to an embodiment of the present invention, includes all information, communication, and multimedia devices, such as, for example, a PMP, an MP3 player, a navigation, a game player, a notebook, a netbook, an advertising panel, a TV, a digital broadcasting receiver, a personal digital assistant (PDA), a smart phone, a tablet PC, as well as all kinds of mobile communication terminals which operate according to communication protocols corresponding to various communication systems, and application devices thereof. The tablet PC will be exemplified in an embodiment of the present invention.

Figure 2:
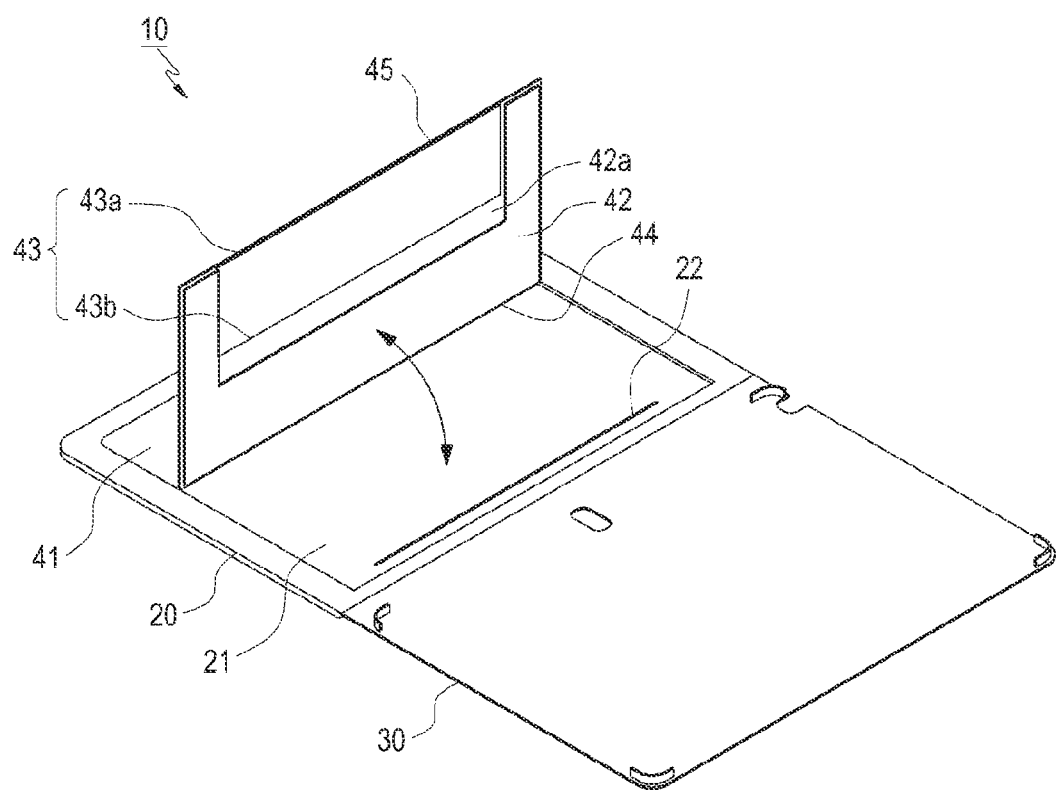
FIG. 2 is a diagram illustrating a perspective view of a second cradling portion in the configuration of the protective cover, according to an embodiment of the present invention.
Figure 3:
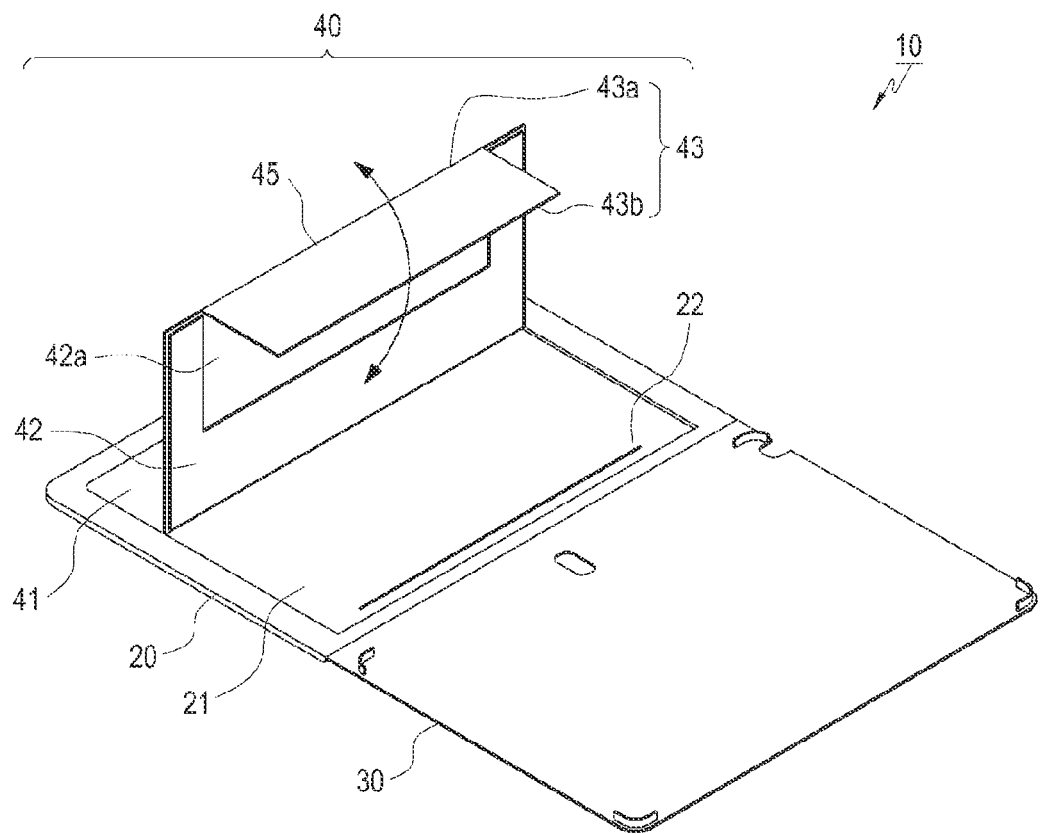
FIG. 3 is a diagram illustrating a perspective view of a third cradling portion in the configuration of the protective cover, according to an embodiment of the present invention.

FIG. 1 is a diagram illustrating an exploded perspective view of a protective cover, according to an embodiment of the present invention. FIG. 2 is a diagram illustrating a perspective view of a second cradling portion in the protective cover, according to an embodiment of the present invention. FIG. 3 is a diagram illustrating a perspective view of a third cradling portion in the protective cover, according to an embodiment of the present invention.

A configuration of a protective cover 10 that protects an electronic device 1 is described with reference to FIG. 1. The protective cover 10 includes a front cover 20, a rear cover 30, and a plurality of cradling portions 40 (also referred to as foldable segments herein). The front cover and rear cover each include a front surface and a rear surface. The rear surface of the front cover 20 is positioned on a front surface of the electronic device 1 so as to open/close the front surface of the electronic device 1 and protect the front surface. The rear cover 30 is connected with the front cover 20 and the rear surface of the rear cover 30 is mounted on a rear surface of the electronic device 1 so as to support the opening/closing of the front cover 20. The plurality of cradling portions 40 are positioned on a rear surface of the front cover 20 in which, depending on use, the cradling portions 40 may be folded to be used as a cradle of the protective cover 10, or may be unfolded to be contained in the rear surface of the front cover 20.

As described above, when the cradling portions 40 are configured to be folded to be used as a cradle, or stand, of the protective cover 10, or to be unfolded again to be accommodated in an accommodation recess 21 formed on the rear surface of the front cover 20, it is possible to use the protective cover 10 as a cradle without using a magnet and to prevent the performances of a magnetic field sensor and an antenna provided in the electronic device from being degraded.

Further, on the rear surface of the front cover 20, the accommodation recess 21 is formed so as to contain the cradling portions 40 therein, as described above.

As illustrated in FIGS. 1 to 3, the cradling portions 40 include a first cradling portion 41, a second cradling portion 42, a third cradling portion 43, a first folding portions (or fold line) 44, and a second folding portion (or fold line) 45. The first cradling portion 41 is configured to be in the accommodation recess 21 and to foldably support the second cradling portion 42, as described in greater detail below. The second cradling portion 42 is provided at an end of the first cradling portion 41 to be folded or unfolded by the first folding portion 44, depending on whether the second cradling portion 42 is used as a cradle of the protective cover 10 or not. The first folding portion 44 is provided between the first and second cradling portions 41 and 42 so as to foldably interconnect the first and second cradling portions 41 and 42 with respect to each other. The second folding portion 45 is provided between the second and third cradling portions 42 and 43 so as to foldably interconnect the second and third cradling portions 42 and 43 with respect to each other.

In addition, a first end of the first cradling portion 41 is foldably connected with the second cradling portion 42 by the first folding portion 44, and a second end of the first cradling portion 41 is provided with a hinge portion 41a that allows the first cradling portion 41 to be rotated from the accommodation recess 21 formed on the front cover 20. The hinge portion 41a will be described in greater detail below with reference to FIG. 9.

Further, a first end 43a of the third cradling portion 43 is foldably connected with an end of the second cradling portion 42 by the second folding portion 42, and a second end 43b of the third cradling portion 43 is joined to a joint recess (or groove) 22 formed on the rear surface of the front cover 20, such that the cradling portion 43 may be used as a cradle of the protective cover 10. When the second end 43b is separated from the joint recess 22, the third cradling portion 43 may be folded to be inserted into and accommodated in a cradling accommodation recess 42a formed in the second cradling portion 42.

When a display unit of the electronic device 1 is used for viewing an image, the cradling portions 40 may be used as a standing cradle, and when the display unit of the electronic device 1 is used in a typing mode, the cradling portions 40 may be used as a typing cradle. Embodiments of the present invention describe the use of the cradling portions 40 as a standing cradle or a typing cradle, but they are not limited thereto. That is, the cradling portions 40 may be variously deformed to and used as cradles of different uses.

That is, when the cradling portions 40 are used as the standing cradle (viewing stand) or the typing cradle (typing stand), the first cradling portion 41 is accommodated in the accommodation recess 21 formed on the front cover 20, and the second cradling portion 42 is folded by being rotated about the first folding portion 44. The third cradling portion 43 is separated from the cradling accommodation recess 42a of the second cradling portion 42 by being rotated about the second folding portion 45 and the second end 43b of the third cradling portion 43 is joined to the joint recess 22 formed on the front cover 20. At this time, the first, second, and third cradling portions 41, 42, and 43 may be used as the standing cradle or the typing cradle.

In addition, when the first, second, and third cradling portions 41, 42, and 43 are not used as a cradle, the second end 43b of the third cradling portion 43 is released from the joint recess 22 of the front cover 20. Then, the third cradling portion is folded by being rotated about the second folding portion 45 to be accommodated in the cradling accommodation recess 42a to be returned to its original position, and the second cradling portion 42 is unfolded by being rotated about the first folding portion 44 to be accommodated in the accommodation recess 21 of the front cover 20. That is, the first, second, third cradling portions 41, 42, and 43 are all accommodated in the accommodation recess 21 of the front cover 20.

In addition, the first, second, and third cradling portions 41, 42, and 43 may be made of any one of, for example, polycarbonate and leather. Apart from the above-described materials, other materials may also be used.

An assembly of the first, second, and third cradling portions 41, 42, and 43 is described with reference to FIG. 1. The first cradling portion 41 is accommodated in the accommodation recess 21 formed on the rear surface of the front cover 20. A first end of the second cradling portion 42 is foldably connected with an end of the first cradling portion 41 via the first folding portion 44, and a second end of the second cradling portion 42 is foldably connected to the first end 43a of the third cradling portion 43 via the second folding portion 45. The third cradling portion 43 is accommodated in the cradling accommodation recess 42a formed in the second cradling portion 42.

Figure 4:
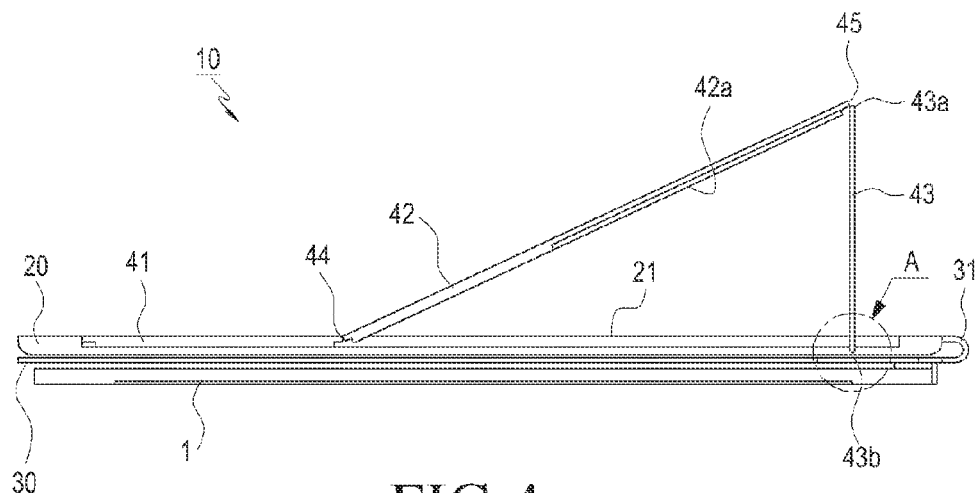
FIG. 4 is a diagram illustrating a side view of the protective cover used as a cradle, according to an embodiment of the present invention.
Figure 5:
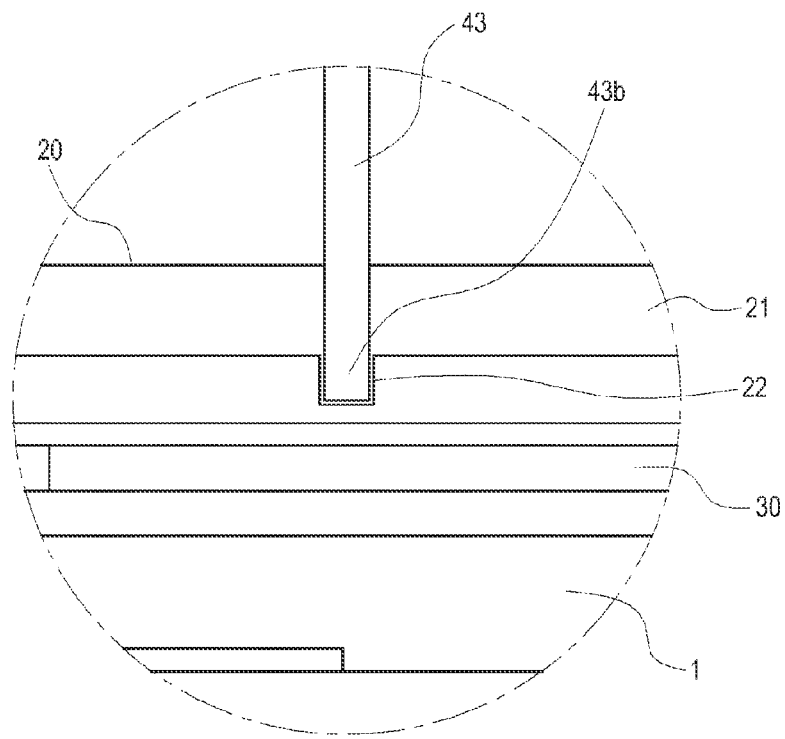
FIG. 5 is a diagram illustrating an enlarged side view of an "A" portion of FIG. 4, according to an embodiment of the present invention.
Figure 6:
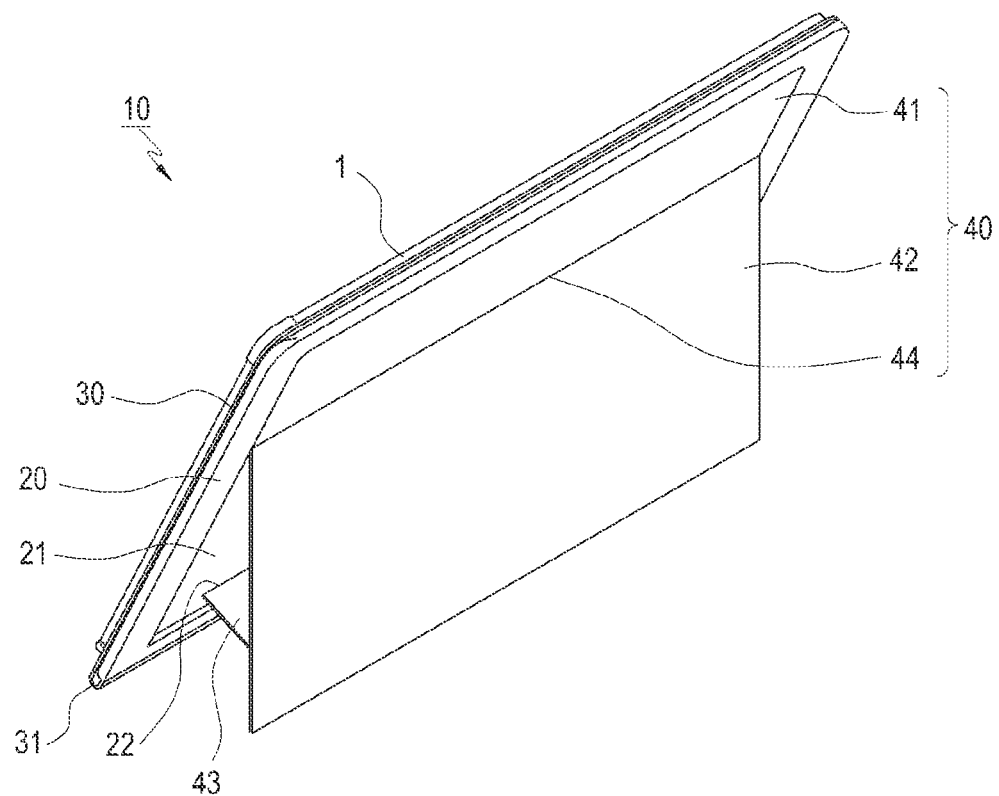
FIG. 6 is a diagram illustrating a perspective view of the protective cover used as a standing cradle, according to an embodiment of the present invention.
Figure 7:
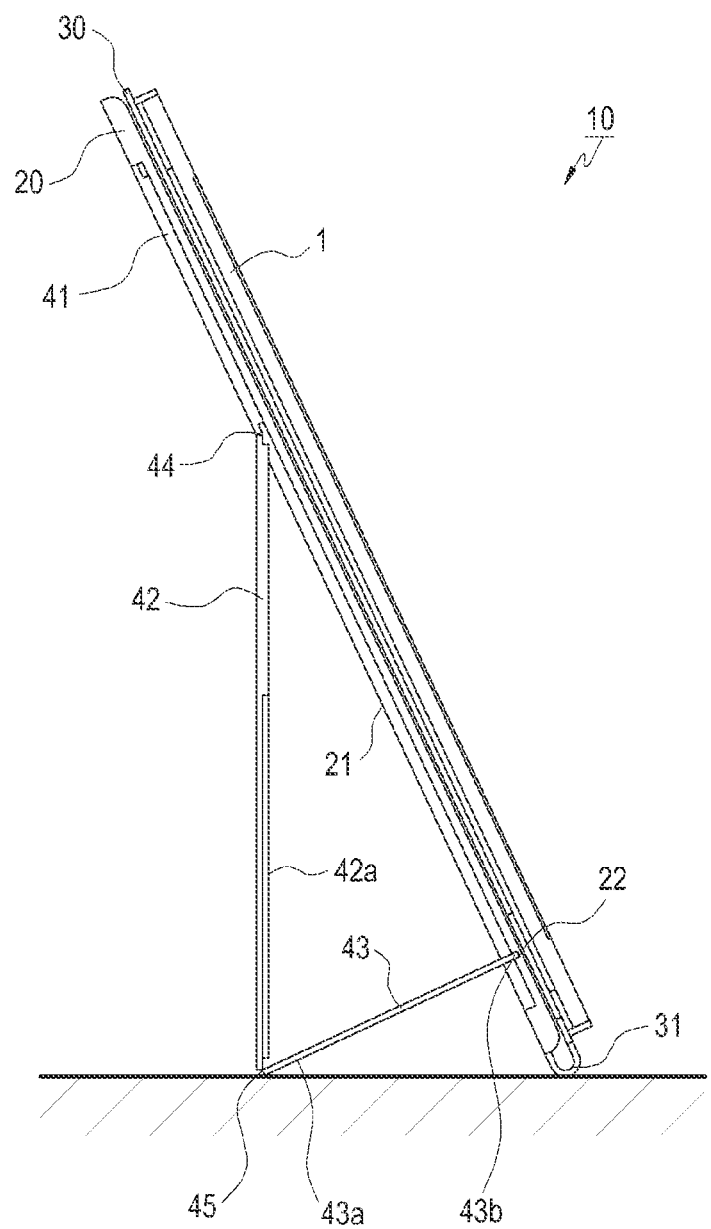
FIG. 7 is a diagram illustrating a side view of the protective cover used as a standing cradle, according to an embodiment of the present invention.
Figure 8:
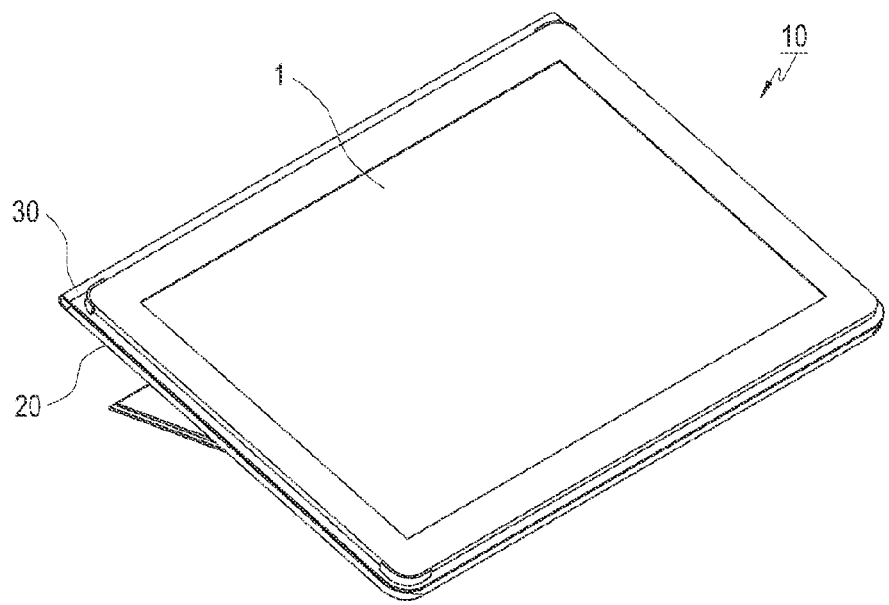
FIG. 8 is a diagram illustrating a perspective view of the protective cover used as a typing cradle, according to an embodiment of the present invention.
Figure 9:
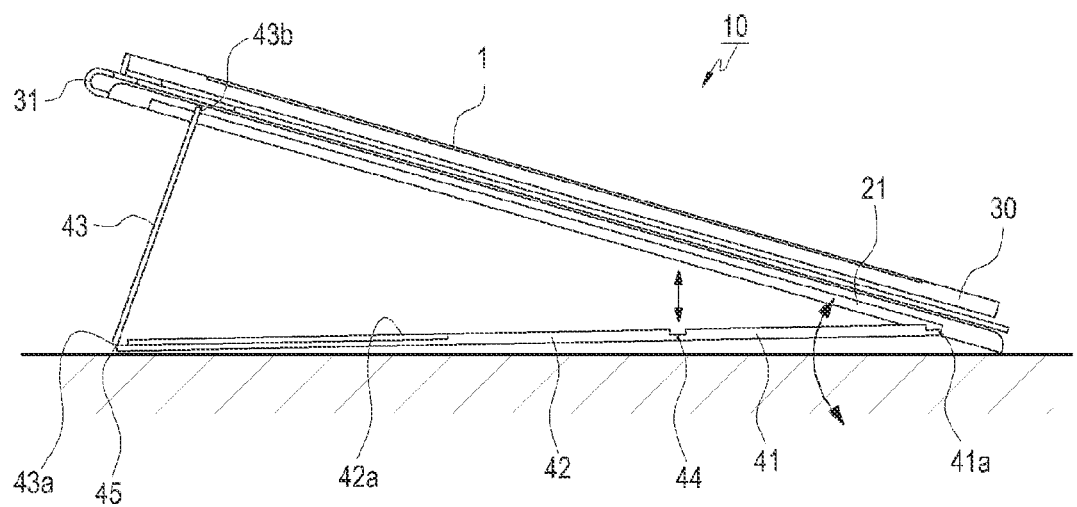
FIG. 9 is a diagram illustrating a side view of the protective cover used as a typing cradle, according to an embodiment of the present invention.

FIG. 4 is a diagram illustrating a side view of the protective cover used as a cradle, according to an embodiment of the present invention. FIG. 5 is a diagram illustrating an enlarged side view of an "A" portion of FIG. 4, according to an embodiment of the present invention. FIG. 6 is a diagram illustrating a perspective view of the protective cover used as a standing cradle, according to an embodiment of the present invention. FIG. 7 is a diagram illustrating the protective cover 10 used as the standing cradle, according to an embodiment of the present invention. FIG. 8 is a diagram illustrating a perspective view of the protective cover 10 used as a typing cradle, according to an embodiment of the present invention. FIG. 9 is a diagram illustrating a side view of the protective cover 10 used as the typing cradle, according to an embodiment of the present invention.

As illustrated in FIGS. 1 to 3, the protective cover 10 includes the front and rear covers 20 and 30 and a connection portion 31. The front cover 20 is positioned on the front surface of the electronic device 1, and the rear cover 30 is connected with the front cover 20 via the connection portion 31 and positioned on the rear surface of the electronic device 1. That is, the front cover 20 is rotated from the rear cover 30 about the connection portion 31 to be opened/closed.

The second cradling portion 42 is folded by being rotated about the first folding portion 44. That is, the second cradling portion 42 is rotated from the first cradling portion 41 about the first folding portion 44. In addition, the second end 43b of the third cradling portion 43 is separated from the cradling accommodation recess 42a formed in the second cradling portion 42 by rotating the third cradling portion 43 about the second folding portion 45. Then, as illustrated in FIGS. 4 and 5, the second end 43b of the third cradling portion 43 is inserted into and joined to the joint recess 22 formed in the accommodation recess 21 of the front cover 20.

The first, second, and third cradling portions 41, 42, and 43 are completed as a cradle of the protective cover 10. When the user uses the first, second, and third cradling portions 41, 42, and 43 as a standing cradle, the second and third cradling portions 42 and 43 are supported on a floor and the front and rear covers 20 and 30 are erected, as illustrated in FIGS. 6 and 7. The display unit of the electronic device 1 provided on the rear cover 30 is also erected and the user may view an image through the display unit in that state.

When the first, second, and third cradling portions 41, 42, and 43 are used as a typing cradle, the front and rear covers 20 and 30 are laid down as illustrated in FIGS. 8 and 9, and the first, second, and third cradling portions 41, 42, and 43 are also laid down. The second and third cradling portions 42 and 43 are laid down such that the electronic device 1 on the rear cover 30 is laid down to be inclined. At this time, the display unit of the electronic device 1 is also laid down to be inclined, and the user may touch the display unit for typing in that state.

As illustrated in FIG. 9, since one end of the first cradling portion 41 is folded about the first folding portion 44 with respect to the second cradling portion 42, the first and second cradling portions 41 and 42, which are folded about the first folding portion 44 with respect to each other, are unfolded. Since the other end of the first cradling portion 41 is formed with the hinge portion 41a to allow the first cradling portion 41 to be rotated from the accommodation recess 21 formed on the front cover 20, the hinge portion 41a allows the first cradling portion 41 to be rotated when the first and second cradling portions 41 and 42 are unfolded. Accordingly, the hinge portion 41a allows the first and second cradling portions 41 and 42 to be arranged linearly such that the first and the cradling portions 41 and 42 provide support to be used as the typing cradle.

Further, when the first, second, and third cradling portions 41, 42, and 43 are not used as the typing cradle, the first cradling portion 41 is reversely rotated again about the hinge portion 41a to be accommodated in the accommodation recess 21 of the front cover 20. In this state, the first, second, and third cradling portions 41, 42, and 43 may not only be used as a standing cradle, but also may be entirely accommodated within the accommodation recess again.

In other words, when the first, second, and third cradling portions 41, 42, and 43 are used as the typing cradle, the second end 43b of the third cradling portion 43 is joined to and supported by the joint recess 22 of the front cover 20, and the first and second cradling portions 41 and 42 are arranged linearly to provide support. Thus, the user may perform typing more stably using the display unit.

As described above, the existing protective cover has a disadvantage in that the typing cradle is formed and supported only by a magnet, and the typing cradle is easily separated or collapsed when an external pressure is applied thereto by touching the display unit of the electronic device. Further, the magnet used in the existing protective cover may affect the magnetic field sensor and the antenna provided in the electronic device, degrading the performance of the electronic device.

In order to overcome such disadvantages, unlike the existing protective cover, when the second and third cradling portions 42 and 43 are folded to be used as a cradle of the protective cover 10 without a magnet, and the second end 43b of the third cradling portion 43 is joined to the joint recess 22 formed in the front cover 20 to provide support, the protective cover 10 used as the cradle may provide a more improved support force as compared to the existing protective cover using the magnet. In addition, since the cradle is not easily separated or collapsed when an external pressure is applied thereto by touching the display unit of the electronic device 1, the user may stably perform typing. Further, it is possible to prevent the performances of the electronic magnetic field sensor and the antenna of the electronic device from being degraded by a magnet used in the existing protective cover.

Figure 10:
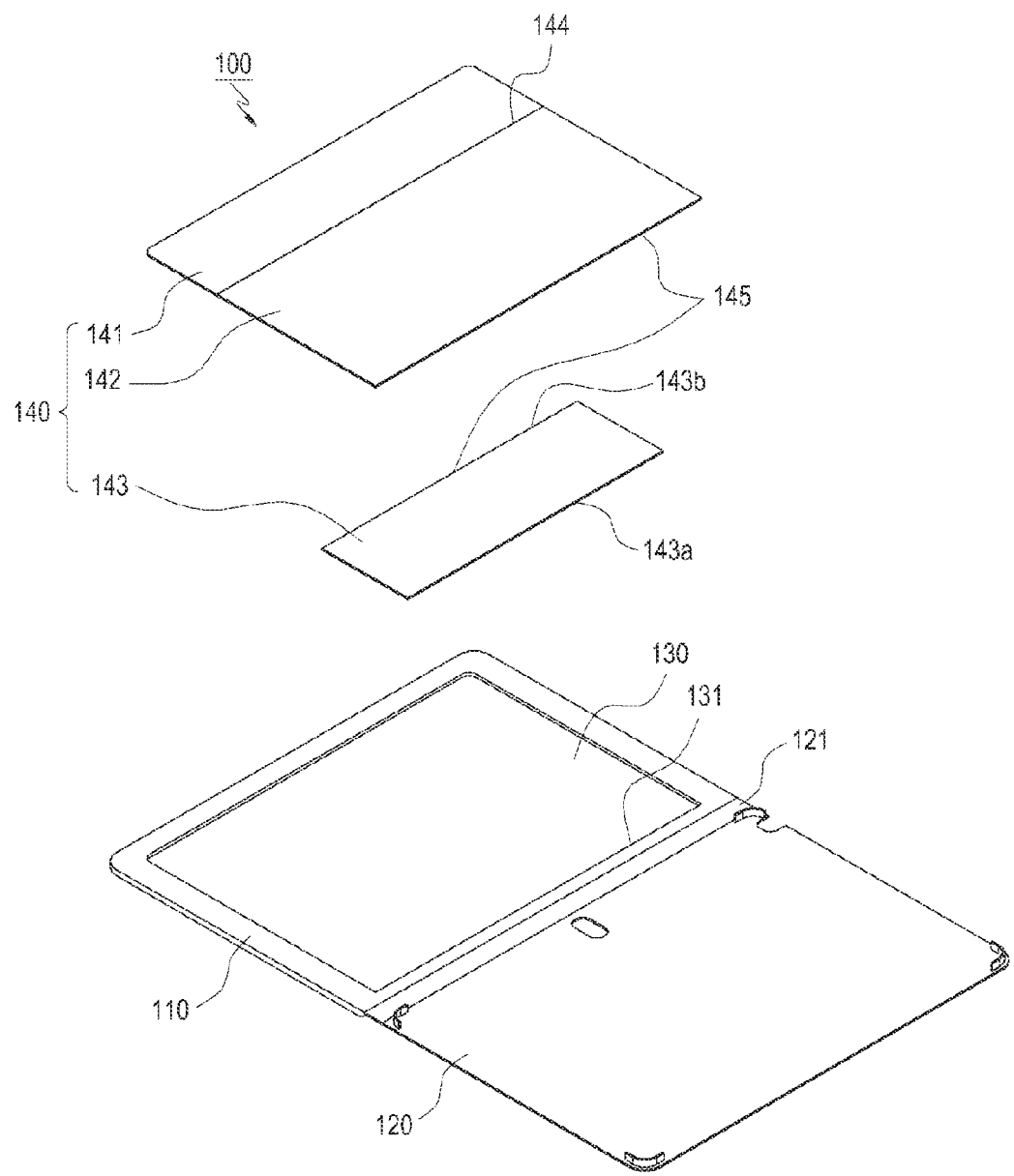
FIG. 10 is a diagram illustrating an exploded perspective view a protective cover, according to another embodiment of the present invention.
Figure 11:
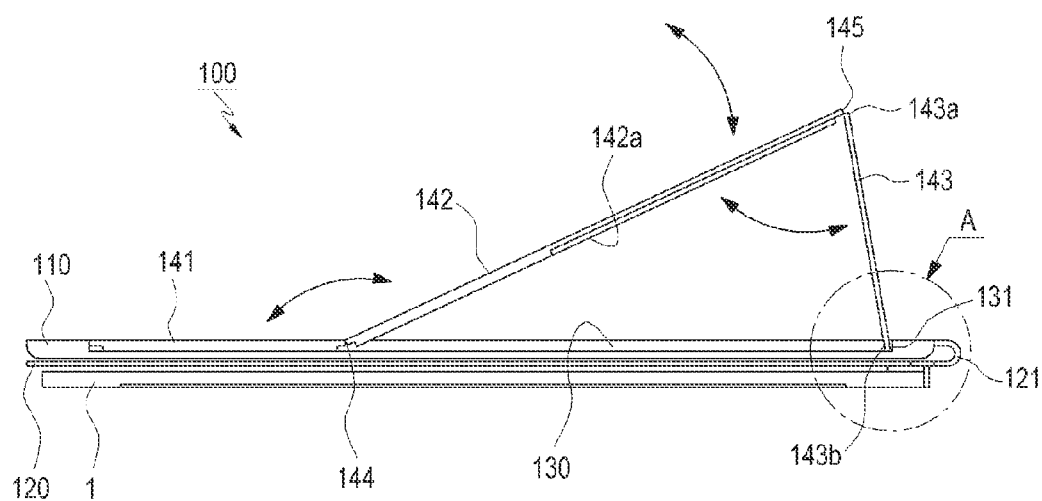
FIG. 11 is a diagram illustrating a side view of the protective cover used as a cradle, according to the embodiment of the present invention of FIG. 10.
Figure 12:
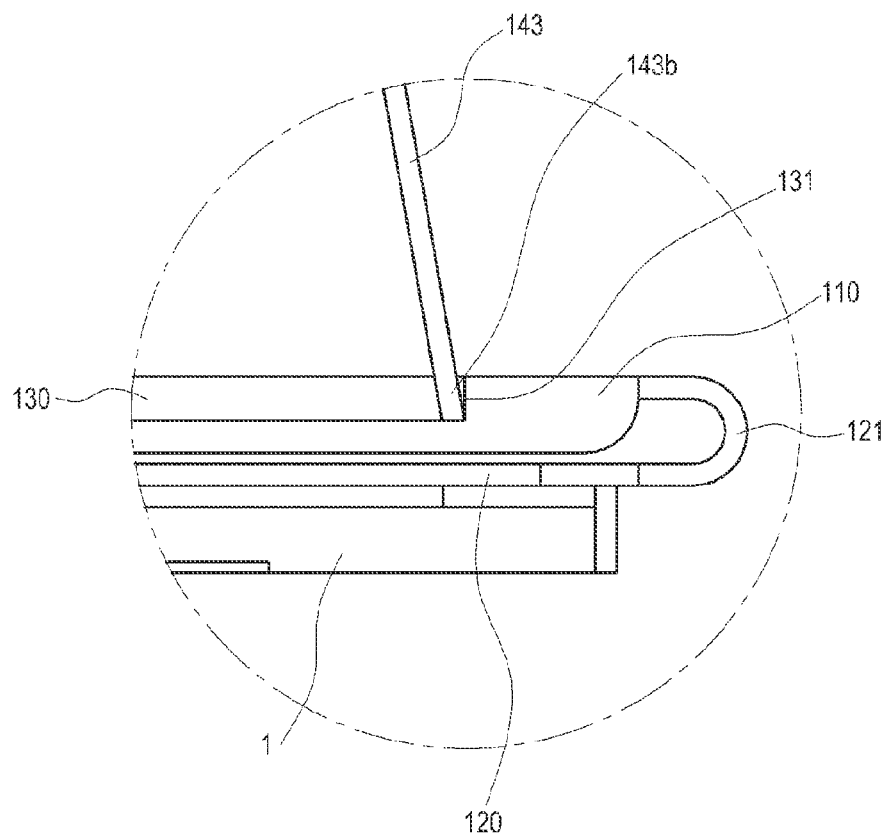
FIG. 12 is a diagram illustrating an enlarged side view of a "B" portion of FIG. 11, according to the embodiment of the present invention of FIG. 10.

FIG. 10 is a diagram illustrating an exploded perspective view of a protective cover, according to another embodiment of the present invention. FIG. 11 is a diagram illustrating a side view of the protective cover, according to an embodiment of the present invention of FIG. 10. FIG. 12 is a diagram illustrating an enlarged side view of a "B" portion of FIG. 11, according to an embodiment of the present invention of FIG. 10.

A configuration of a protective cover 100 is described with reference to FIGS. 10 to 12. The protective cover 100 includes a front cover 110, a rear cover 120, an accommodation portion 130, and a plurality of cradling portions 140. The front cover 110 is positioned on a front surface of the electronic device 1 to protect the front surface of the electronic device 1 and to open/close the front surface. The rear cover 120 is connected with the front cover 110 and mounted on the rear surface of the electronic device 1 so as to support the opening/closing of the front cover 110. The accommodation portion 130 is provided on the rear surface of the front cover 110 to accommodate the cradling portions 140, as described in greater detail below. The plurality of cradling portions 140 are provided in the accommodation portion 130 such that, upon being used, the plurality of cradling portions 140 are folded and held by a catching portion 131 formed in the accommodation portion 130, thereby being used as a cradle of the protective cover 100. Upon not being used as a cradle, the plurality of cradling portions 140 are accommodated in the accommodation portion 130.

The accommodation portion 130 may be formed as an accommodation recess so as to accommodate the cradling portions 140 therein.

As illustrated in FIGS. 10 and 11, the cradling portions 140 includes a first cradling portion 141, a second cradling portion 142, a third cradling portion 143, a first folding portion 144, and a second folding portion 145. The first cradling portion 141 is configured to be accommodated in the accommodation recess 130 and to foldably support the second cradling portion 142, as described in greater detail below. The second cradling portion 142 is provided at an end of the first cradling portion 141 to be folded or unfolded about the first folding portion 144 depending on whether the cradling portions 140 are used as a cradle of the protective cover 100 or not. The third cradling portion 143 is provided at an end to be folded or unfolded about the second folding portion 145 depending on whether the cradling portions 140 are used as the cradle of the protective cover 100. The first folding portion 144 is provided between the first and second cradling portions 141 and 142 so as to foldably interconnect the first and second cradling portions 141 and 142. The second folding portion 142 is provided between the second and third cradling portions 142 and 143 so as to foldably interconnect the second and third cradling portions 142 and 143.

In addition, a first end of the first cradling portion 141 is foldably connected with the second cradling portion 142 via the first folding portion 144, and a second end of the first cradling portion 141 is provided with a hinge portion 141a so as to allow the first cradling portion 141 to be rotated from the accommodation recess 130 formed on the front cover 110. The hinge portion 141a is described in greater detail below.

A first end 143a of the third cradling portion 143 is foldably connected with an end of the second cradling portion 142, and a second end 143b of the third cradling portion 143 is held and supported by the catching portion 131 formed in the accommodation portion 130, such that the third cradling portion 143 may be used as the cradle of the protective cover 100. When the second end 143b of the third cradling portion 143 is released from the catching portion 131, the third cradling portion 143 may be folded, inserted and accommodated in the cradling accommodation recess 142a formed on the second cradling portion 142.

When the cradling portions 140 are used as the standing cradle or the typing cradle, the first cradling portion 141 is accommodated within the accommodation recess 130 formed on the front cover 110 and the second cradling portion 142 is folded by being rotated about the first folding portion 144. The third cradling portion 143 is folded by being rotated about the second folding portion 145, the second cradling portion 142 is released from the cradling accommodation recess 142a, and the second end 143b of the third cradling portion 143 is caught by the catching portion 131 formed in the accommodation portion 130. The first, second, and third cradling portions 141, 142, and 143 may be used as the standing cradle or the typing cradle.

In addition, when the first, second, and third cradling portions 141, 142, and 143 are not used as a cradle, the second end 143b of the third cradling portion 143 is released from the catching portion 131 of the accommodation portion 130 and the third cradling portion 143 is folded again about the second folding portion 145 to be accommodated in the cradling accommodation recess 142a to its original position, and the second cradling portion 142 is folded by being rotated about the first folding portion 144 again to be accommodated into the accommodation recess 130 of the front cover 110. That is, the first, second, and third cradling portions 141, 142, and 143 are accommodated in the accommodation recess 130 of the front cover 110.

Assembly of the cradling portions 140 is the same as that of the cradling portions 40 in the embodiment described above with respect to FIG. 1.

Figure 13:
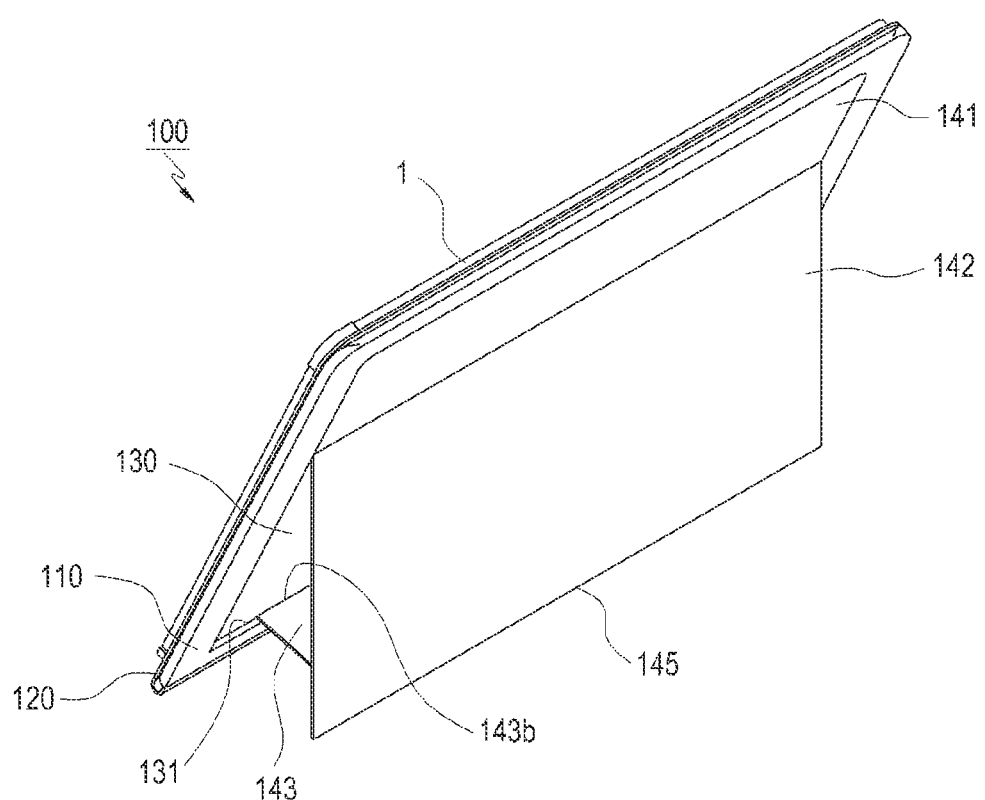
FIG. 13 is a diagram illustrating a perspective view of the protective cover used as a standing cradle, according to the embodiment of the present invention of FIG. 10.
Figure 14:
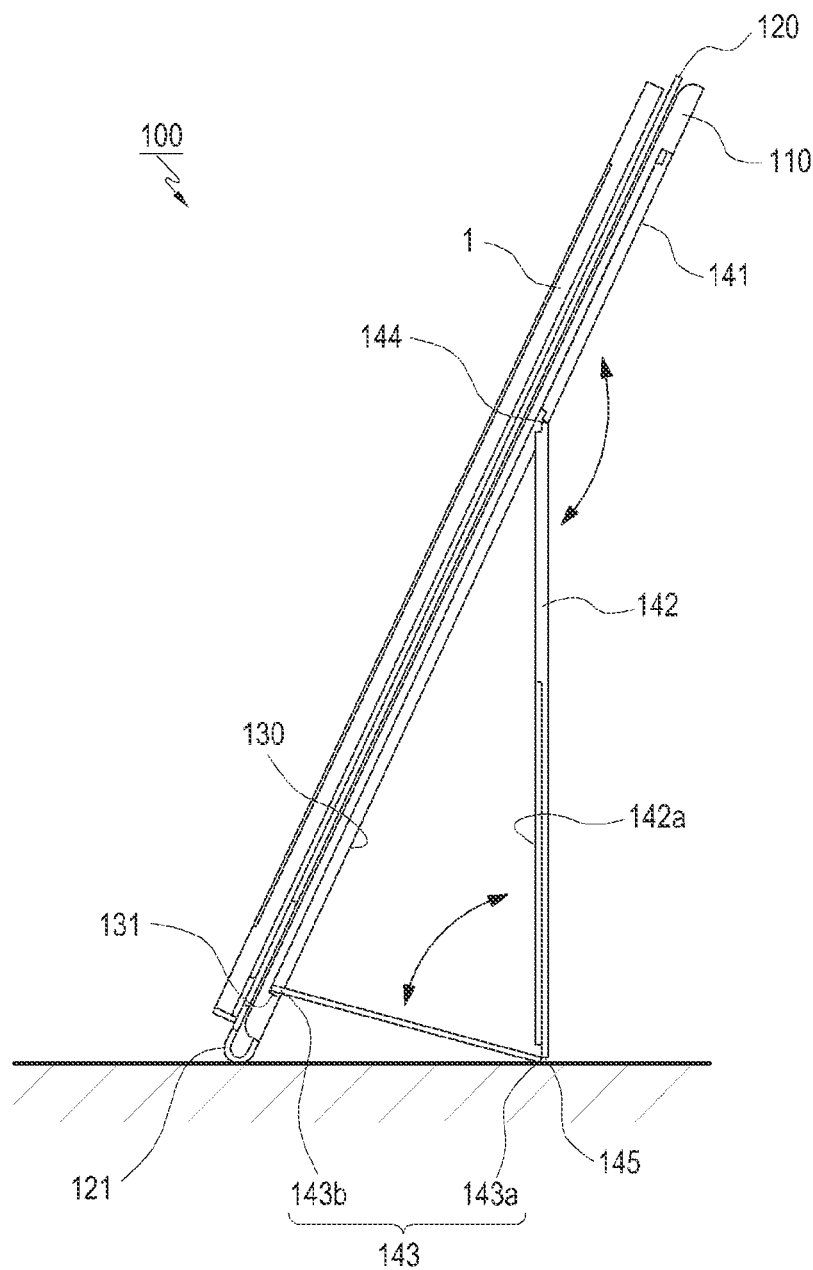
FIG. 14 is a diagram illustrating a side view of the protective cover used as a standing cradle, according to the embodiment of the present invention of FIG. 10.
Figure 15:
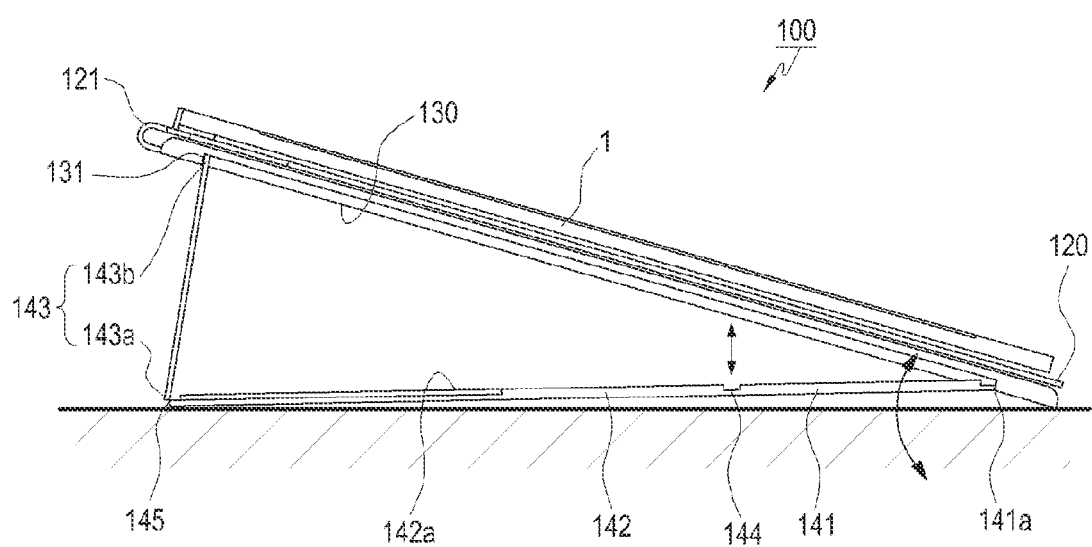
FIG. 15 is a diagram illustrating a perspective view of the protective cover used as a typing cradle, according to the embodiment of the present invention of FIG. 10.

FIG. 13 is a diagram illustrating a perspective view of the protective cover 100 used as a standing cradle, according to the embodiment of the present invention of FIG. 10. FIG. 14 is a diagram illustrating a side view of the protective cover 100, according to the embodiment of the present disclosure of FIG. 10. FIG. 15 is a diagram illustrating a perspective view of the protective cover 100 used as a typing cradle, according to the embodiment of the present invention of FIG. 10.

As illustrated in FIGS. 10 to 12, the protective cover 100 includes the front and rear covers 110 and 120 and a connection portion 121. The front cover 110 is positioned on the front surface of the electronic device 1, and the rear cover 120 is connected with the front cover 110 via the connection portion 121 and positioned on the rear surface of the electronic device 1. That is, the front cover 110 may be opened/closed by being rotated about the connection portion 121 with respect to the rear cover 120.

The second cradling portion 142 is folded by being rotated about the first folding portion 144. That is, the second cradling portion 142 is rotated about the first folding portion 144 with respect to the first cradling portion 141. Then, the second end 143b of the third cradling portion 143 is rotated about the second folding portion 145 such that the third cradling portion 143 is released from the cradling accommodation recess 142a formed in the second cradling portion 142. As illustrated in FIGS. 11 and 12, the second end 143b of the third cradling portion 143 is caught and supported by the catching portion 131 of the accommodation portion 130.

The first, second, and third cradling portions 141, 142, and 143 are completed as a cradle of the protective cover 100. When the user uses the first, second, and third cradling portions 141, 142, and 143 as a standing cradle, the second and third cradling portions 142 and 143 are supported on the floor and the front and rear covers 110 and 120 are erected, as illustrated in FIGS. 13 and 14. The display unit of the electronic device 1 provided on the rear cover 120 is also erected, and in this state, the user may view an image through the display unit.

When the first, second, and third cradling portions 141 142 143 are used as the typing cradle, the front and rear covers 110 and 120 are laid down, as illustrated in FIG. 15, and the first, second, and third cradling portions 141, 142, and 143 are also laid down. The second and third cradling portions 142 and 143 are supported on the floor such that the electronic device 1 on the rear cover 120 is also laid down. The display unit of the electronic device 1 is also laid down, and the user may touch the display unit for typing.

As illustrated in FIG. 15, since one end of the first cradling portion 141 is folded with respect to the second cradling portion 142 about the first folding portion 144, the first and second cradling portions 141 and 142 are unfolded with respect to each other about the first folding portion 144. Since the an end of the first cradling portion 141 is provided with the hinge portion 141a so as to allow the first cradling portion 141 to be rotated from the accommodation recess 130 formed on the front cover 110, the first cradling portion 141 may be rotated about the hinge portion 141a such that the first and second cradling portions 141 and 142 are unfolded from each other. Accordingly, the first and second cradling portions 141 and 142 may be arranged linearly to be used as the typing cradle.

In addition, when the first, second, and third cradling portions are not used as the typing cradle, the first cradling portion 141 is rotated reversely again about the hinge portion 141a to be accommodated in the accommodation recess 130 of the front cover 110.

In other words, even when the user touches the display unit for typing, the other end of the third cradling portion 143 is caught and supported by the catching portion 131 in the accommodation portion 130, and the first and second cradling portions 141 and 142 are arranged linearly to be supported, the user may stably perform typing.

As described above, according to an embodiment of the present invention, the second and third cradling portions 142 and 143 are folded to be used as a cradle of the protective cover 100 without using a magnet, unlike the existing protective cover, and the second end 143b of the third cradling portion 143 is caught and supported by the catching portion 131 in the accommodation portion 130. As a result, the cradle of the protective cover 100 can be easily formed, and the second and third cradling portions 142 and 143 may provide a more improved support force when they are used as the cradle as compared to the existing protective cover that uses a magnet. In addition, since the cradle is not easily separated or collapsed by an external force applied when touching the display unit of the electronic device, the user may stably perform typing. Further, since no magnet is needed, unlike the existing protective cover, it is possible to prevent degradation of performances of a magnetic field sensor and an antenna of the electronic device.

Figure 16:
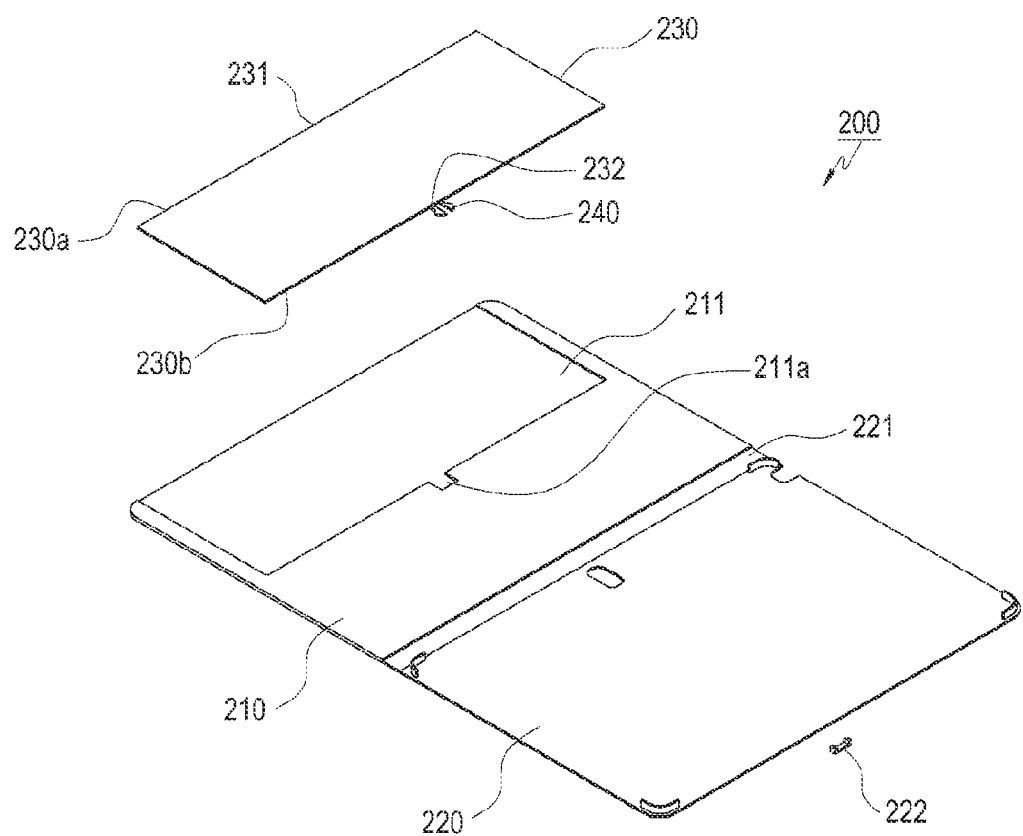
FIG. 16 is a diagram illustrating an exploded perspective view of a protective cover, according to another embodiment of the present invention.
Figure 17:
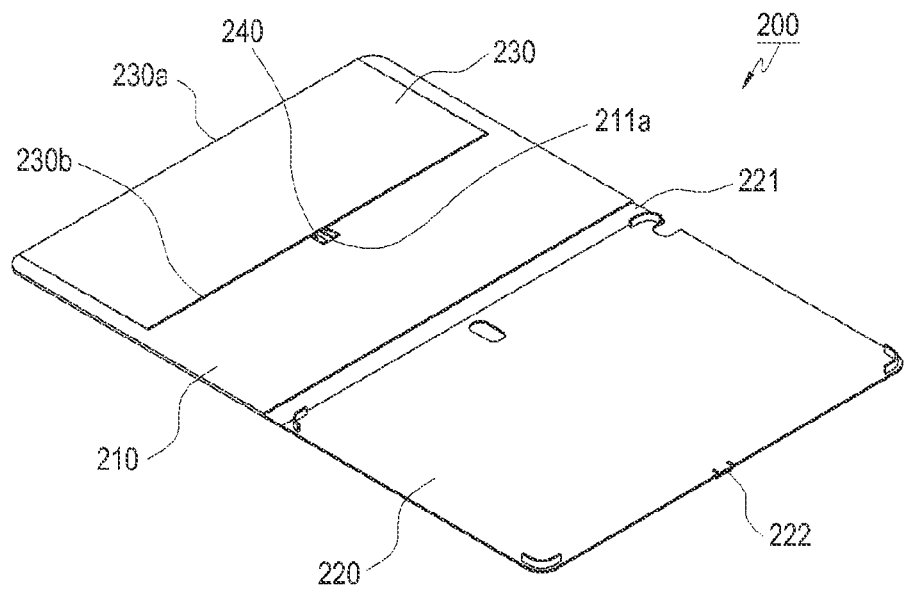
FIG. 17 is a diagram illustrating a perspective view of a second cradling portion of the protective cover, according to the embodiment of the present invention of FIG. 16.
Figure 18:
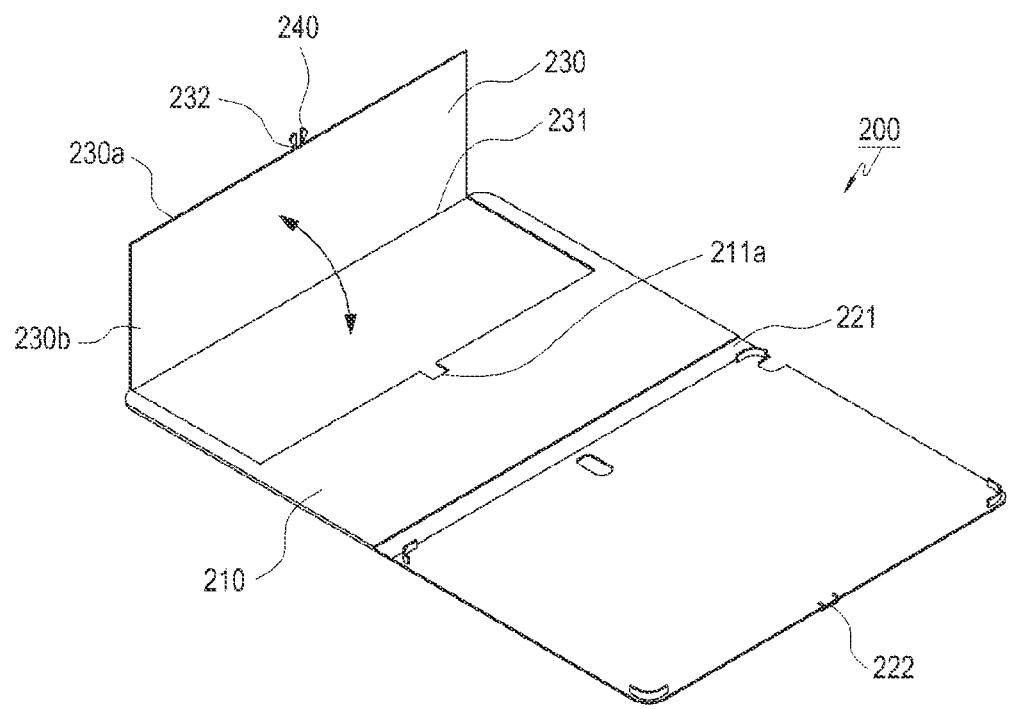
FIG. 18 is a diagram illustrating a perspective view of a third cradling portion of the protective cover, according to the embodiment of the present invention of FIG. 16.
Figure 19:
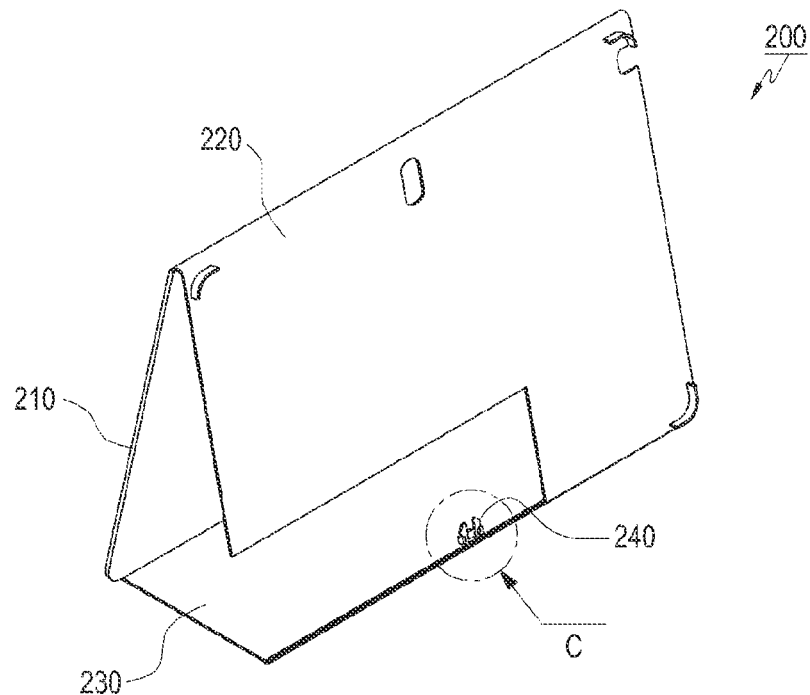
FIG. 19 is a diagram illustrating a side view of the protective cover used as a cradle, according to the embodiment of the present invention of FIG. 16.
Figure 20:
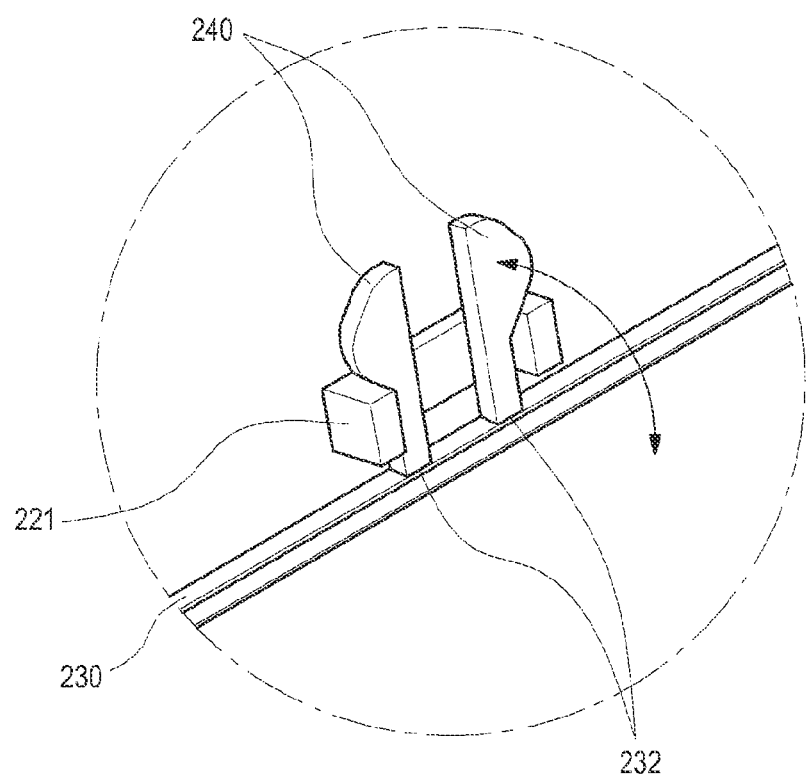
FIG. 20 is a diagram illustrating an enlarged side view illustrating a "C" portion of FIG. 19, according to the embodiment of the present invention of FIG. 16.

FIG. 16 is a diagram illustrating an exploded perspective view of a protective cover, according to an embodiment of the present invention. FIG. 17 is a diagram illustrating a perspective view of a second cradling portion of the protective cover 200, according to the embodiment of the present invention of FIG. 16. FIG. 18 is a diagram illustrating a perspective view of a third cradling portion of the protective cover 200, according to the embodiment of the present invention of FIG. 16. FIG. 19 is a diagram illustrating a side view of the protective cover used as a cradle, according to the embodiment of the present invention of FIG. 16. FIG. 20 is a diagram illustrating an enlarged side view of a "C" portion of FIG. 19, according to the embodiment of the present invention of FIG. 16.

A configuration of a protective cover 200 that protects the electronic device 1 is described with reference to FIGS. 16 and 17. The protective cover 200 includes a front cover 210, a rear cover 220, a cradling portion (or stand segment) 230, and a cradling hook (or attaching) unit 240. The front cover 210 is positioned on a front surface of the electronic device 1 to protect the front surface of the electronic device 1 and to open/close the front surface, and the rear cover 220 is mounted on a rear surface of the electronic device 1 to be connected with the front cover 210 and to support opening/closing of the front cover 210. The cradling portion 230 is provided on the rear surface of the front cover 210, such that the cradling portion 230 is rotated to be folded or unfolded to be used as a cradle of the protective cover 200 or to be accommodated in the rear surface of the of the front cover 210. The cradling hook unit 240 is provided on the cradling portion 230 such that depending on whether the cradling hook unit 240 is engaged with or disengaged from a locking unit 222 provided on the rear cover 220, the cradling portion 230 may be used as a cradle of the protective cover 200 (when engaged) or accommodated in an accommodation recess 211 formed on the rear surface of the cradling portion 230 (when disengaged).

In addition, the accommodation recess 211 is formed on the rear surface of the front cover 210 so as to allow the cradling portion 230 to be accommodated therein. The accommodation recess 211 is formed with a hook accommodation recess 211a so as to allow the cradling hook unit 240 to be accommodated therein.

A first folding portion 231 is provided at a first end 230a of the cradling portion 230 so that the cradling portion 230 may be rotated at the end of the front cover 210 to be folded or unfolded. A second folding portion 232 is provided at a second end 230b of the cradling portion 230 so that the cradling portion 230 may be rotated to be folded so as to allow the cradling hook unit 240 to be engaged with or disengaged from the locking unit 222 provided on the rear cover 220.

When the cradling portion 230 is used as a standing cradle or a typing cradle, the cradling portion 230 is unfolded from the accommodation recess 211 formed on the front cover 210 and rotated about the first folding portion 231. The cradling hook unit 240 is also rotated about the second folding portion 232 formed at the other end 230b of the cradling portion 230. The cradling hook unit 240 is inserted into the locking unit 222 on the rear cover 220 to be locked and fixed. The cradling portion 230 is used as the cradle of the protective cover 200. That is, depending on the user's use, the cradling portion 230 may be used as the standing cradle or the typing cradle.

When the cradling portion 230 is not used as a cradle, the cradling hook unit 240 is separated from the locking unit 222, and the cradling hook unit 240 is rotated about the second folding portion 232. The cradling portion 230 is rotated again about first folding portion 231 to be folded and accommodated in the accommodation recess 211 of the front cover 210.

Figure 21:
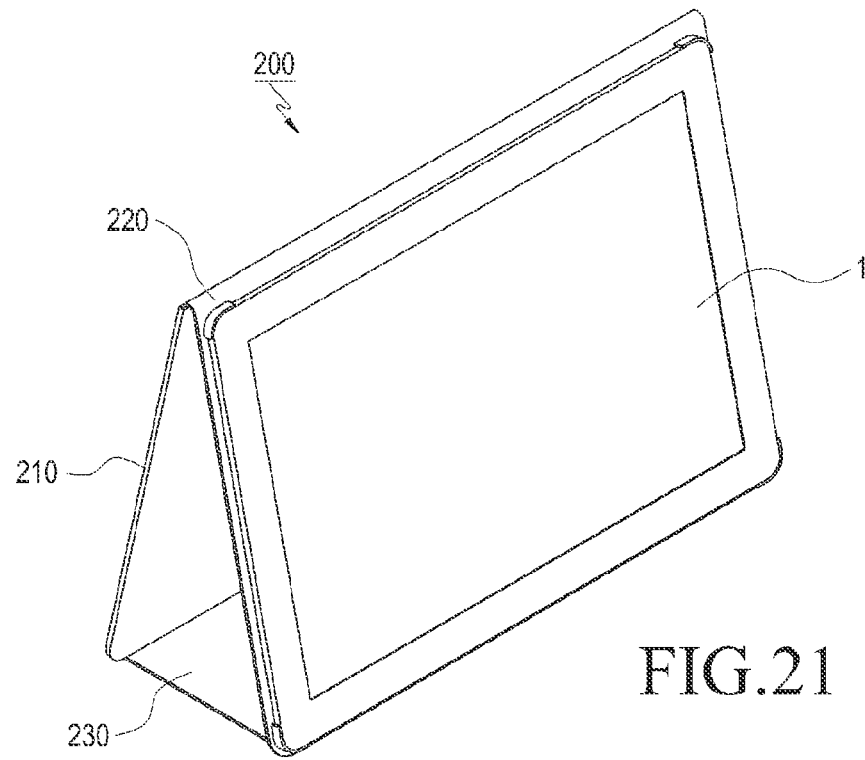
FIG. 21 is a diagram illustrating a perspective view of the protective cover used as a standing cradle, according to the embodiment of the present invention of FIG. 16.
Figure 22:
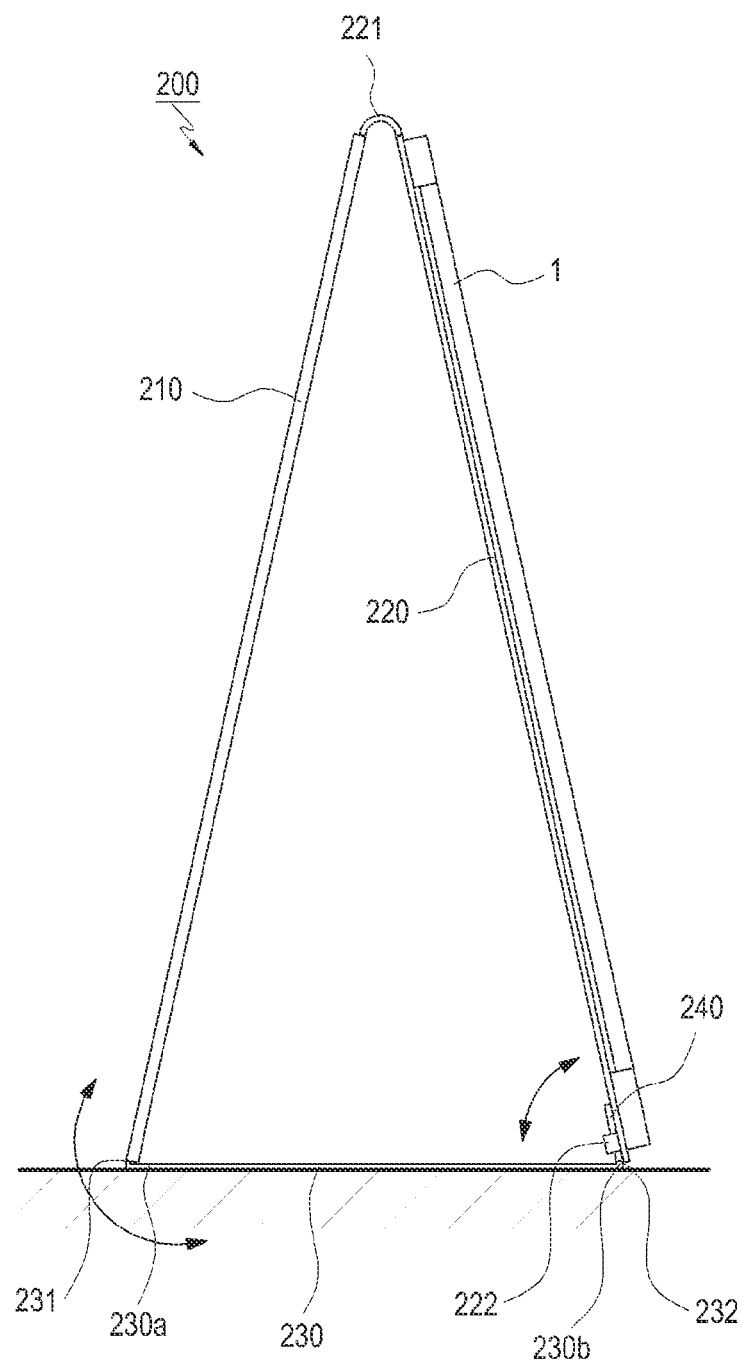
FIG. 22 is a diagram illustrating a side view of the protective cover used as the standing cradle, according to the embodiment of the present invention of FIG. 16.
Figure 23:
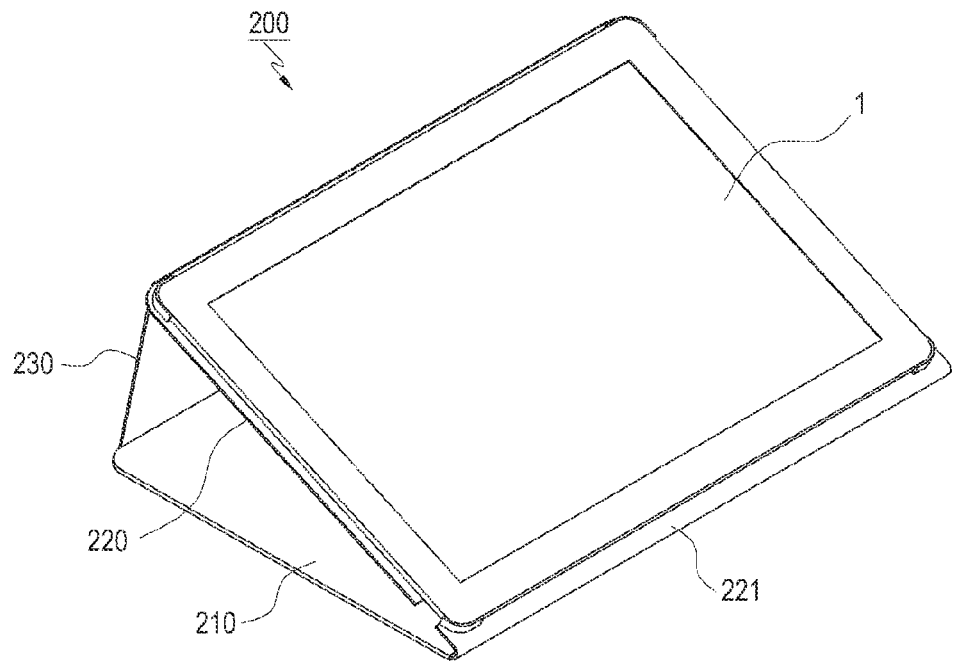
FIG. 23 is a diagram illustrating a perspective view of the protective cover used as a typing cradle, according to the embodiment of the present invention of FIG. 16.
Figure 24:
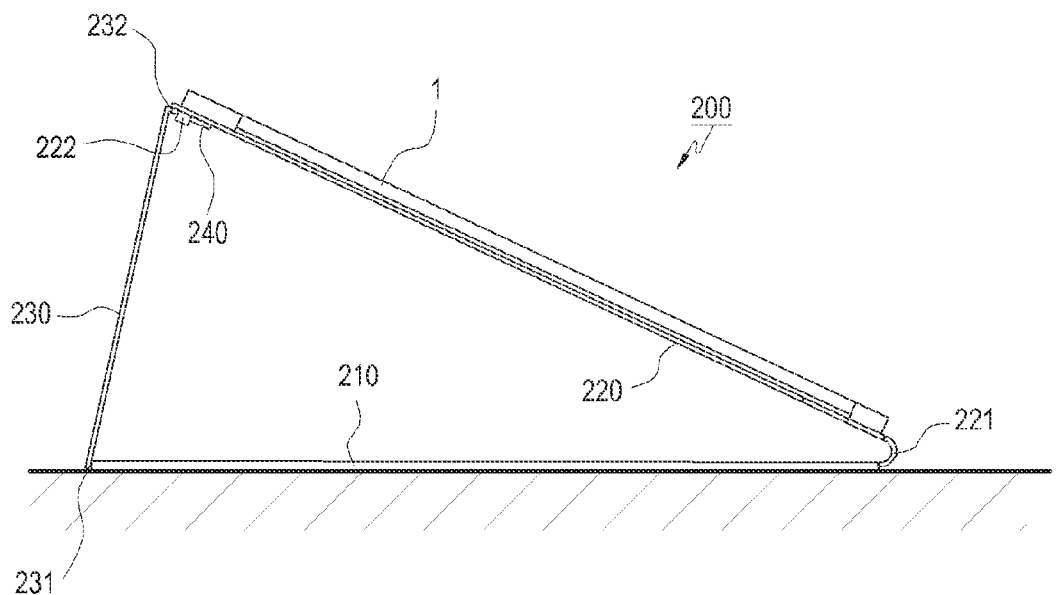
FIG. 24 is a diagram illustrating a side view of the protective cover used as a typing cradle, according to the embodiment of the present invention of FIG. 16.

FIG. 21 is a diagram illustrating a perspective view of the protective cover used as a standing cradle, according to the embodiment of the present invention of FIG. 16. FIG. 22 is a diagram illustrating a side view of the protective cove used as the standing cradle, according to the embodiment of the present invention of FIG. 16. FIG. 23 is a diagram illustrating a perspective view of the protective cover used as a typing cradle, according to the embodiment of the present invention of FIG. 16. FIG. 24 is a diagram illustrating a side view of the protective cover 200 used as the typing cradle, according to the embodiment of the present invention of FIG. 16.

First, as illustrated in FIG. 16, the protective cover 200 includes the front and rear covers 210 and 220 and a connection portion 221. The front cover 210 is positioned on the front surface of the electronic device 1 and the rear cover 220 is connected with the front cover 210 via the connection portion 221 and positioned on the rear surface of the electronic device 1. That is, the front cover 210 is rotated about the connection portion 221 from the rear cover 220 to be opened/closed.

In this state, as illustrated in FIG. 18, the cradling portion 230 is rotated about the first folding portion 231 to be unfolded. The cradling hook unit 240 formed at the second end 230b of the cradling portion 230 is also rotated therewith.

When the cradling hook unit 240 is rotated about the second folding portion 232, the cradling hook unit 240 is inserted, locked, and fixed into the locking unit 222 formed on the rear cover 220. The cradling portion 230 may be used as a cradle of the protective cover 200.

When the user uses the cradling portion 230 as a standing cradle, the cradling portion 230 is supported on the floor and the front and rear covers 210 and 220 are erected, as illustrated in FIGS. 21 and 22. The display unit of the electronic device 1 provided on the rear cover 220 is also erected, and the user may watch an image through the display unit in this state.

When the cradling portion 230 is used as a typing cradle, the erected front and rear covers 210 and 220 are laid down as illustrated in FIGS. 23 and 24, and the cradling portion 230 is laid down. The cradling portion 230 is supported on the floor and the electronic device 1 on the rear cover 220 is laid down. At this time, the display unit of the electronic device 1 is also laid down, and in this state, the user may touch the display unit for typing.

That is, since the cradling hook unit 240 on the cradling portion 230 is locked to the locking unit 222 on the rear cover 220, the user may stably perform typing.

As described above, in this embodiment of the present invention, the cradling hook unit 240 is rotated about the second folding portion 232 and inserted into the locking unit 222 on the rear cover 220 to support the rear cover 220 so that the protective cover 200 can be used as a cradle for the electronic device 1. When cradling hook unit 240 is released from the locking unit 222, the cradling portion 230 is allowed to be rotated about the first folding portion 231 to be accommodated in the accommodation recess 211 formed on the front cover 210. With this configuration, it is possible to further improve the cradling function and the support force of the protective cover 200 without using a magnet, which is included in the existing protective cover.

Hereinafter, a protective cover of another embodiment of the present invention is described with reference to FIGS. 25 to 33. In the following description of the protective cover, detailed descriptions of constructions or processes already described above are omitted and only the differences are described.

Figure 25:
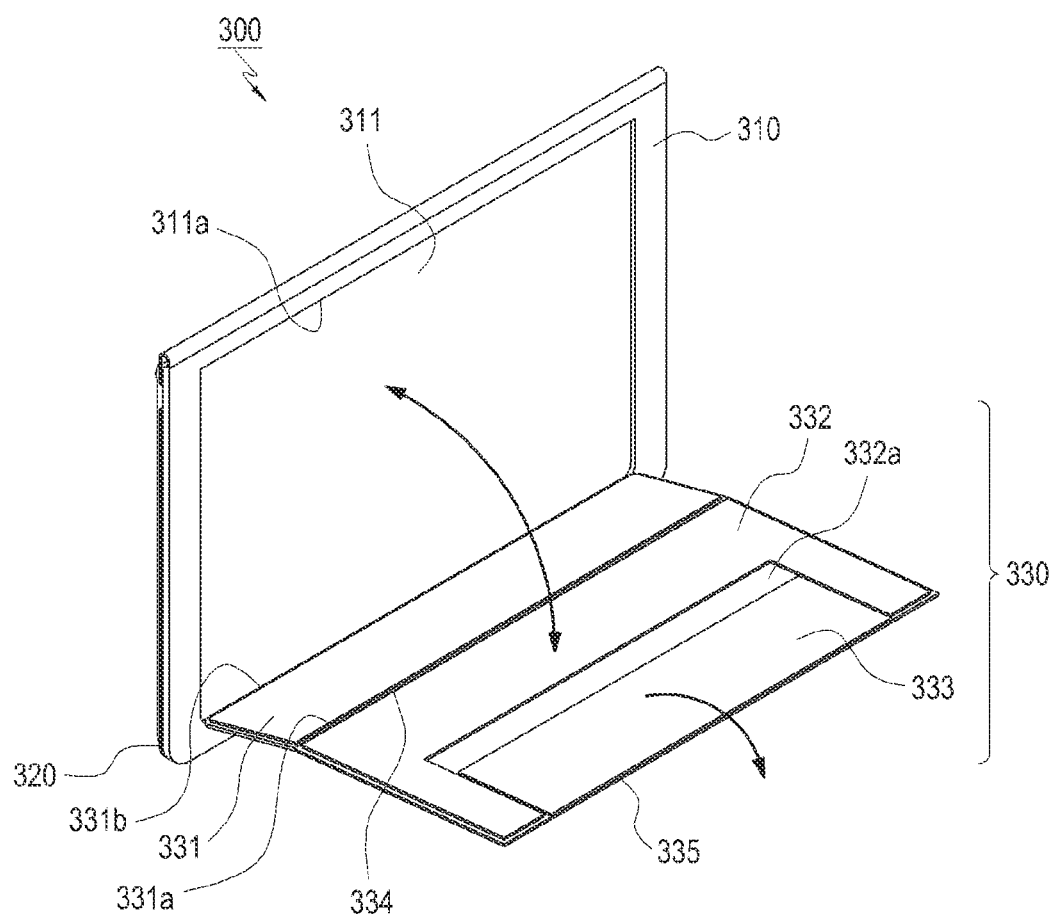
FIG. 25 is a diagram illustrating a perspective view of first and second cradling portions of the protective cover used as a standing cradle, according to another embodiment of the present invention.
Figure 26:
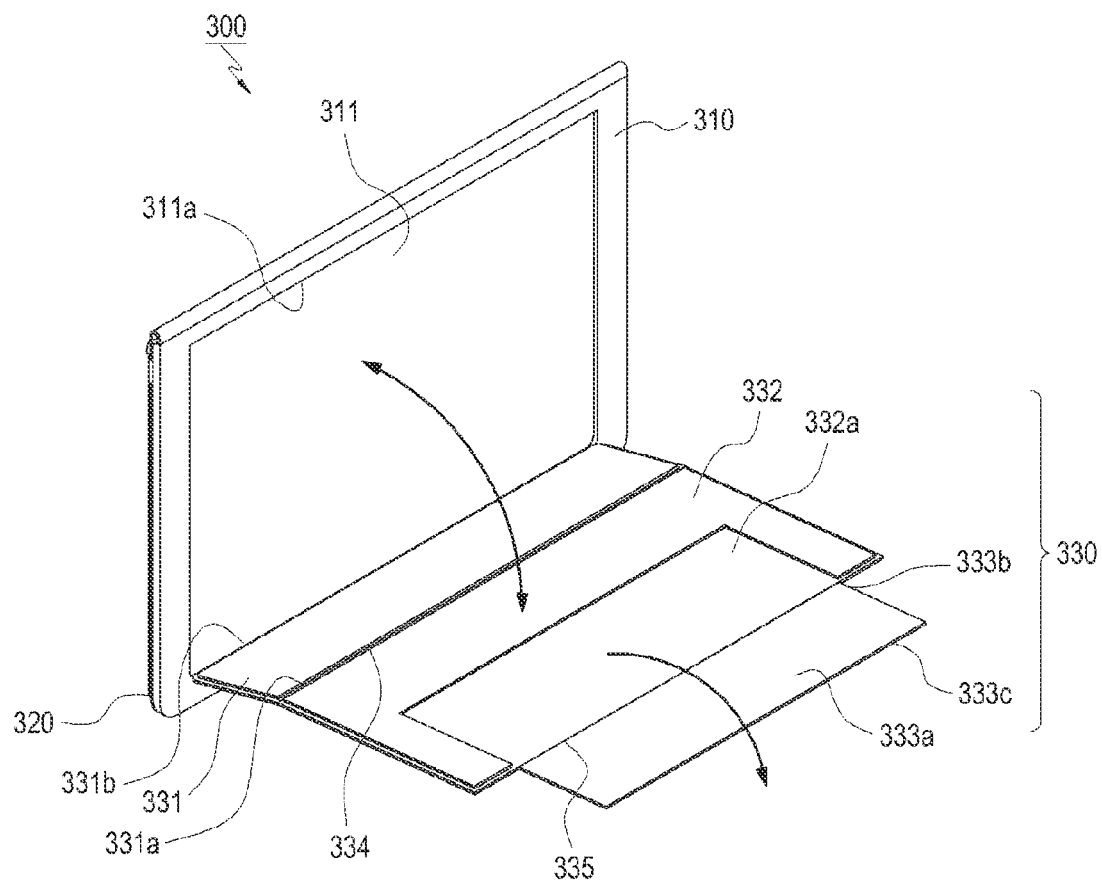
FIG. 26 is a diagram illustrating a perspective view of a third cradling portion of the protective cover used as the standing cradle, according to the embodiment of the present invention of FIG. 25.

FIG. 25 is a diagram illustrating a perspective view of first and second cradling portions of the protective cover used as a standing cradle, according to another embodiment of the present invention. FIG. 26 is a diagram illustrating a perspective view of a third cradling portion of the protective cover used as the standing cradle, according to the embodiment of the present invention of FIG. 25.

The construction of a protective cover 300 is described with reference to FIGS. 25 and 26.

The protective cover 300 includes a front cover 310, a rear cover 320, an accommodation portion 311, and a plurality of cradling portions 330. The front cover 310 is positioned on a front surface of the electronic device 1 to protect the front surface of the electronic device and to open from and/or close upon the front surface. The rear cover 320 is connected with the front cover 310 and mounted on the rear surface of the electronic device 1 so as to support the opening/closing of the front cover 310. The accommodation portion 311 is provided on a rear surface of the front cover 310 such that the plurality of cradling portions 330 may be accommodated therein, as described in greater detail below.

When the plurality of cradling portions 330 are configured such that the protective cover 300 may be used as a standing cradle, the plurality of cradling portions 330 are folded such that a surface of a third cradling portion 333 directly contacts an inner surface of the accommodation portion 311, as described in greater detail below. When the plurality of cradling portions 330 are configured such that the protective cover 300 may be used as a typing cradle, the third cradling portion 333 is separated from the inner surface of the accommodation portion 311 and an end of the third cradling portion 333 is held by a catching portion 311a formed in the accommodation portion 311. When the protective cover 300 is not used as the standing cradle or the typing cradle, the plurality of cradling portions 300 may be accommodated in the accommodation portion 311.

Thus, without using a magnet, the cradling function of the protective cover 300 may be further enhanced, and deterioration of performances of a magnetic sensor or an antenna provided in the electronic device may be prevented.

The processes of configuring the cradling portions 330 when the protective cover 300 is used as the standing cradle and the typing cradle are described in greater detail below. As illustrated in FIGS. 25 and 26, the plurality of cradling portions 330 include a first cradling portion 331, a second cradling portion 332, the third cradling portion 333, a first folding portion 334, and a second folding portion 335. The second cradling portion 332 is provided at a first end 331a of the first cradling portion 331 to be rotated about the first folding portion 334, depending on the use of the protective cover 300. The third cradling portion 333 is provided at an end of the second cradling portion 332 to be folded or unfolded about the second folding portion 335 depending on the use of the protective cover 300. The first folding portion 334 is provided between and foldably interconnects the first cradling portion 331 and the second cradling portion 332. The second folding portion 335 is provided between and foldably interconnects the second cradling portion 332 and the third cradling portion 333.

In addition, the first end 331a of the first cradling portion 331 is foldably connected with the second cradling portion 332 via the first folding portion 334, and a second end of the first cradling portion 331 is provided as a hinge portion 331b to allow the first cradling portion 331 to be rotated outwardly from the accommodation recess 311 formed on the front cover 310.

A first end 333b of the third cradling portion 333 is foldably connected with an end of the second cradling portion 332, and a second end 333c of the third cradling portion 333 is caught and supported by the catching portion 311a formed in the accommodation portion 311. When the second end 333c of the third cradling portion 333 is released from the catching portion 311a, the third cradling portion 333 may be folded and accommodated in a cradling accommodation recess 332a formed in the second cradling portion 332.

As described above, the plurality of cradling portions 330 may be configured so that the protective cover 300 may be used as the standing cradle when the electronic device is set to an image viewing mode, and also may be configured so that the protective cover 300 may be used as the typing cradle when the electronic device is set to a typing mode. Configurations of the cradling portions 330 are described in the present embodiment as an example, however, configurations of the cradling portions 330 and uses of the protective cover 300 are not limited thereto. That is, the cradling portions 330 may be configured in various manners and used for other purposes in accordance with a user's intent.

In addition, the third cradling portion 333 includes a supporting surface 333a, which directly contacts and faces the inner surface of the accommodation portion 311, so that the first to third cradling portions 331 to 333 may be configured so that the protective cover 300 may be used as a standing cradle.

Figure 27:
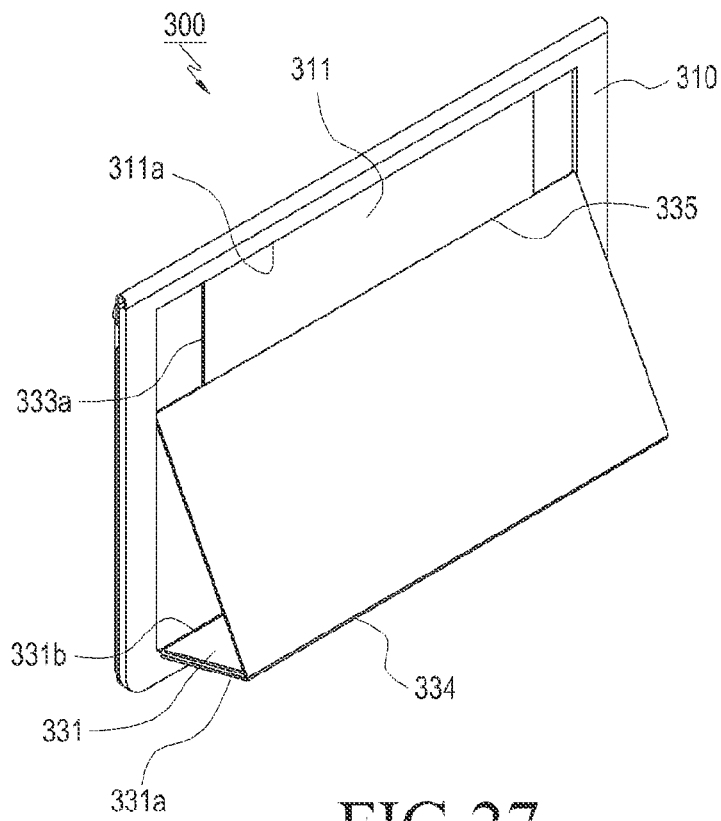
FIG. 27 is a diagram illustrating a perspective view of the second cradling portion facing the rear surface of the front cover with the protective cover used as the standing cradle, according to the embodiment of the present invention of FIG. 25.
Figure 28:
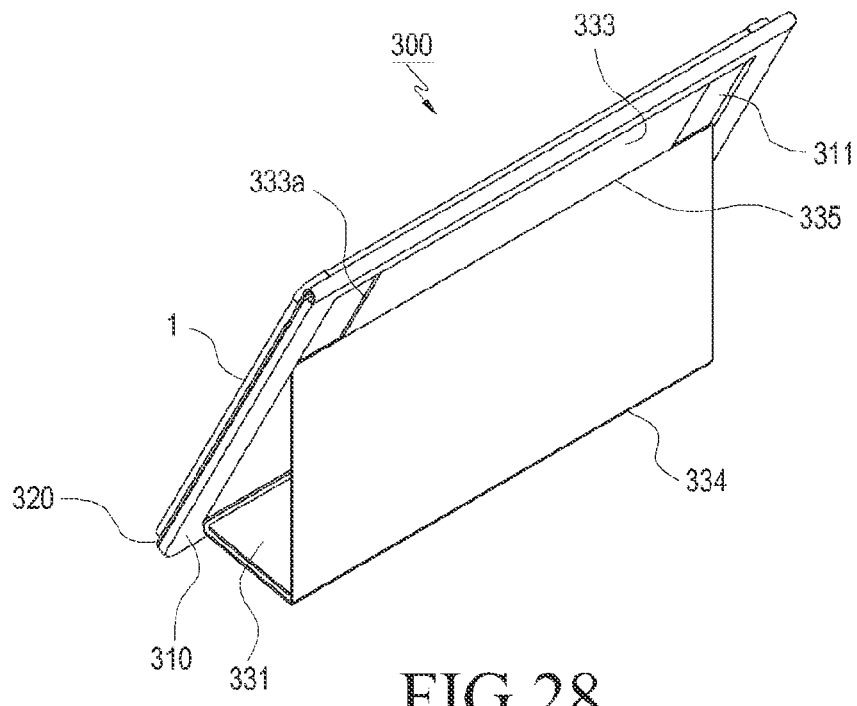
FIG. 28 is a diagram illustrating a perspective view of the protective cover used as the standing cradle, according to the embodiment of the present invention of FIG. 25.
Figure 29:
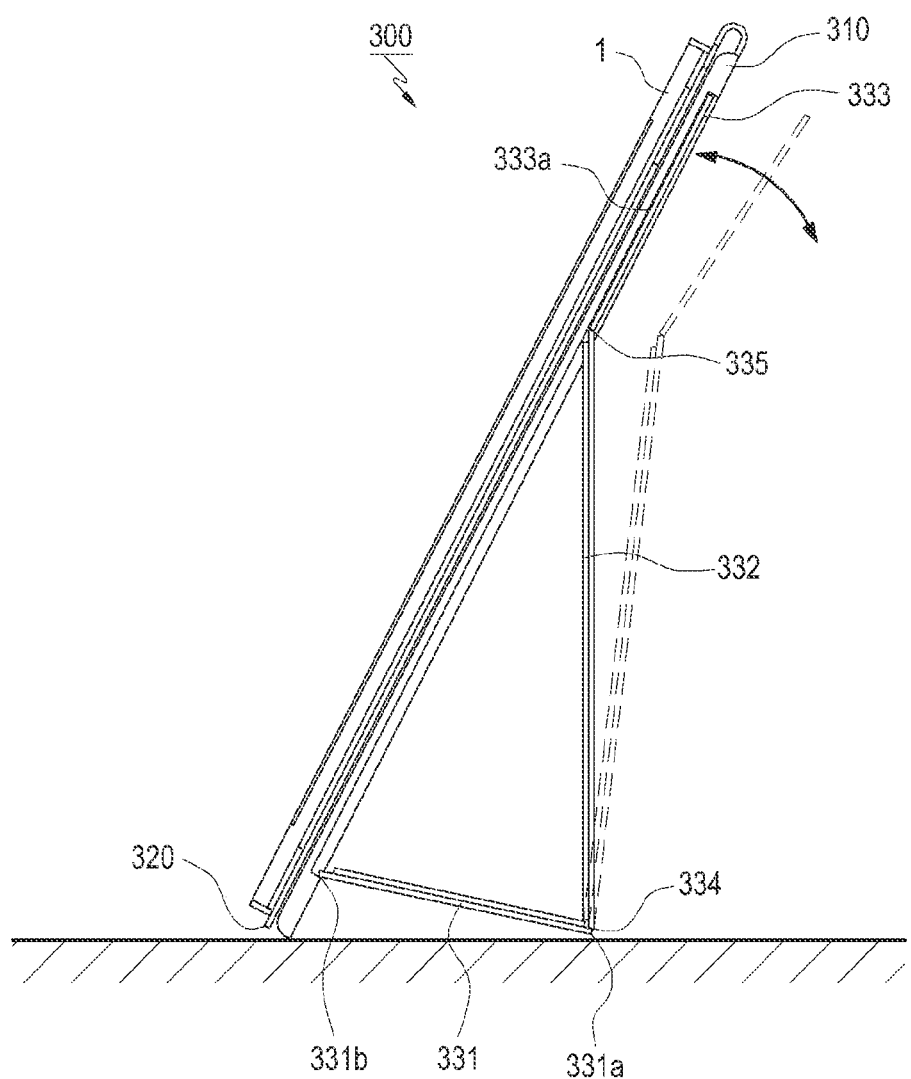
FIG. 29 is a diagram illustrating a side view of the protective cover used as the standing cradle, according to the embodiment of the present invention of FIG. 25.

FIG. 27 is a diagram illustrating a perspective view of the third cradling portion facing the rear surface of the front cover in the protective cover used as the standing cradle, according to the embodiment of the present invention of FIG. 25. FIG. 28 is a diagram illustrating a perspective view of the protective cover used as the standing cradle, according to the embodiment of the present invention of FIG. 25. FIG. 29 is a diagram illustrating a side view of the protective cover used as the standing cradle, according to the embodiment of the present invention of FIG. 25.

As illustrated in FIGS. 25 and 26, when the protective cover 300 is used as the standing cradle, the first cradling portion 331 is rotated about the hinge portion 331b formed at the second end of the first cradling portion 331 and within the accommodation portion 311 of the front cover 310. The third cradling portion 333 is rotated about the second folding portion 335 to be unfolded and removed from the inside of the cradling accommodation recess 332a of the second cradling portion 332. In this state, as illustrated in FIGS. 27 and 28, the second cradling portion 332 is rotated about the first folding portion 334 and held to be inclined. The support surface 333a of the third cradling portion 333 is positioned to directly contact and face the inner surface of the accommodation portion 311.

As illustrated in FIG. 29, upon facing the inner surface of the accommodation portion 311, the support surface 333a of the third cradling portion 333 supports the inclination of the first cradling portion 331 and the second cradling portion 332. For example, the first and second cradling portions 331 and 332 are configured in a triangular shape when the third cradling portion 333 is configured in this manner.

When the user uses the first to third cradling portions 331 to 333 as the standing cradle, as illustrated in FIGS. 28 and 29, the first cradling portion 331 is supported on a surface, the second cradling portion 332 is inclined, and the third cradling portion 333 is positioned to face the inner surface of the accommodation portion 311 so that the first and second cradling portions 331 and 332 are maintained in the triangular shape. Using the first to third cradling portions 331 to 333, the front and rear covers 310 and 320 are erected. The display unit of the electronic device 1 provided on the rear cover 320 is also erected, and in this state, the user may view an image through the display unit.

Figure 30:
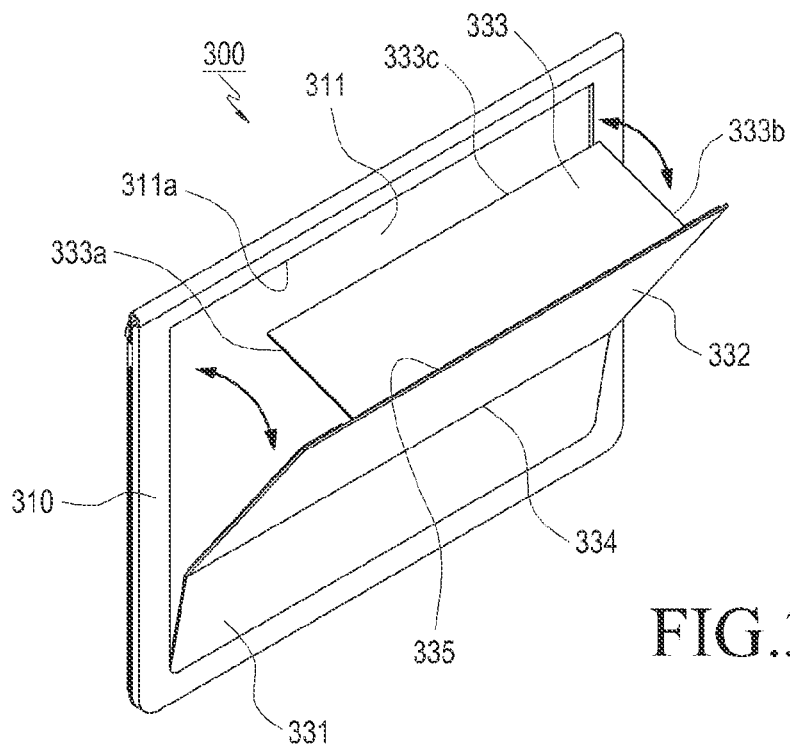
FIG. 30 is a diagram illustrating a perspective view of the third cradling portion released from the rear surface of the front cover with the protective cover used as the typing cradle, according to the embodiment of the present invention of FIG. 25.
Figure 31:
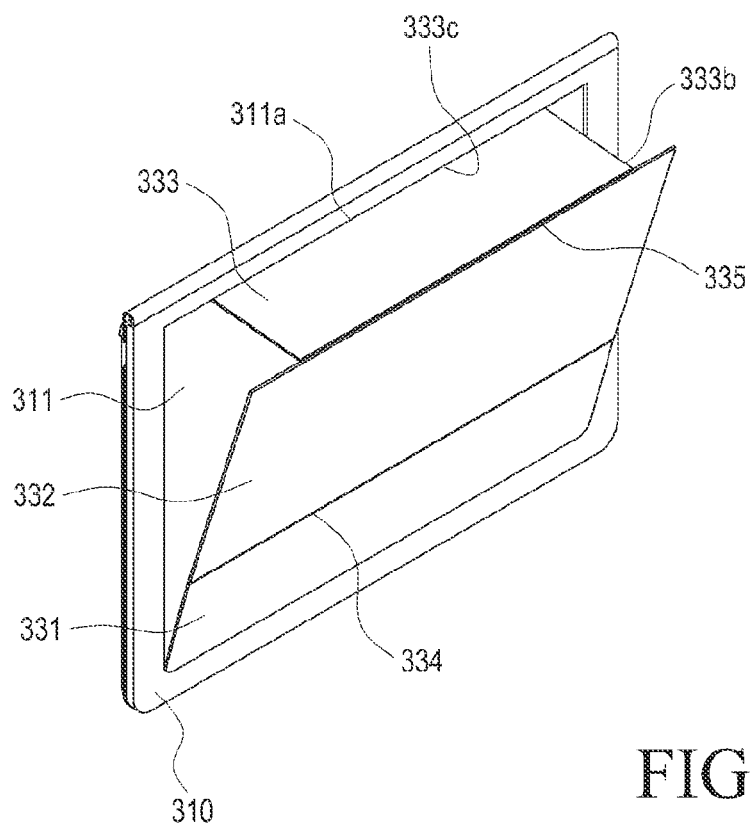
FIG. 31 is a diagram illustrating a perspective view of the cradling portions of the protective cover used as a typing cradle, according to the embodiment of the present invention of FIG. 25.
Figure 32:
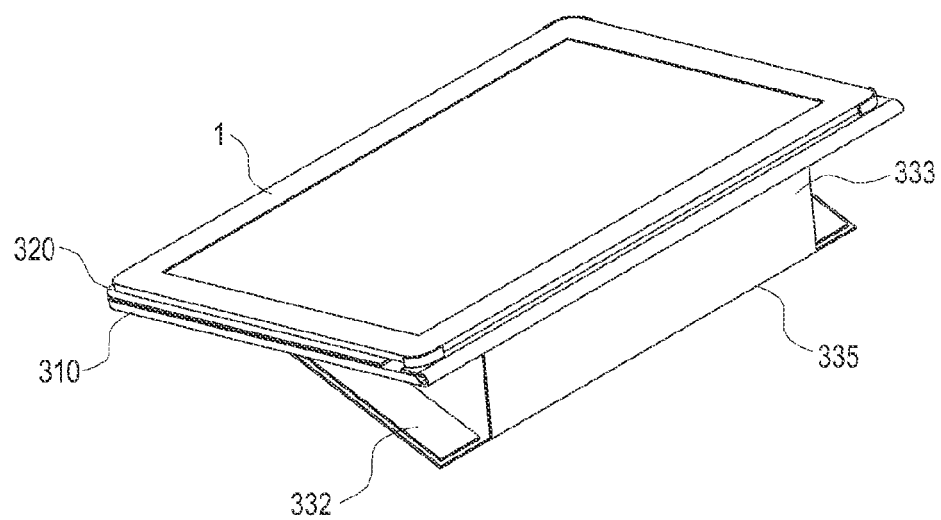
FIG. 32 is a diagram illustrating a perspective view of the protective cover used as the typing cradle, according to the embodiment of the present invention of FIG. 25.
Figure 33:
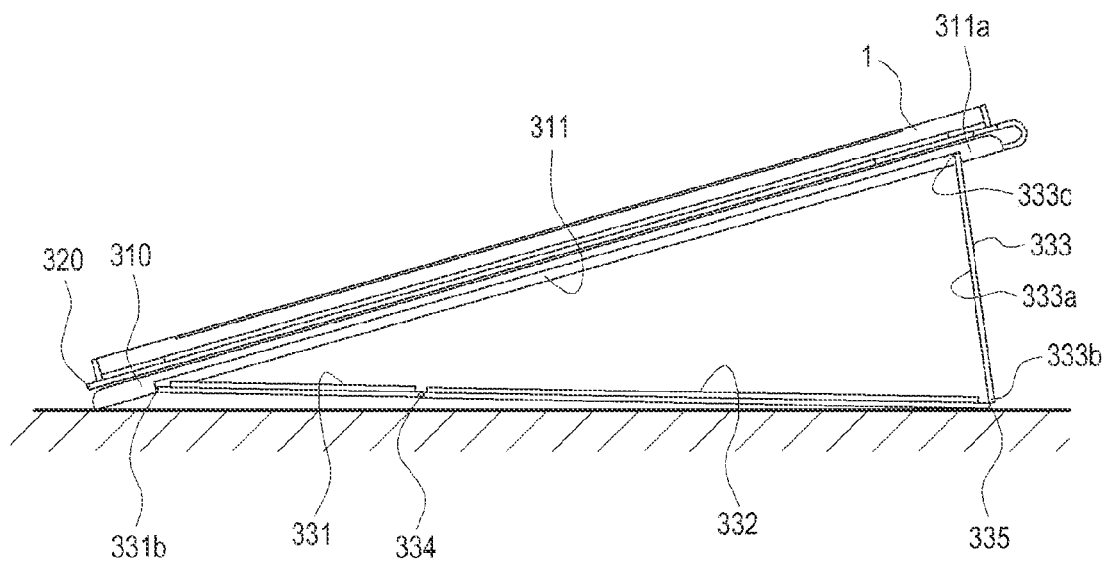
FIG. 33 is a diagram illustrating a side view of the protective cover used as the typing cradle, according to the fourth embodiment of the present invention of FIG. 25.

FIG. 30 is a diagram illustrating a perspective view of the third cradling portion released from the rear surface of the front cover in the protective cover used as the typing cradle, according to the embodiment of the present invention of FIG. 25. FIG. 31 is a diagram illustrating a perspective view of the cradling portions of the protective cover used as a typing cradle, according to the embodiment of the present invention of FIG. 25. FIG. 32 is a diagram illustrating a perspective view of the protective cover used as the typing cradle, according to the embodiment of the present invention of FIG. 25. FIG. 33 is a diagram illustrating a side view of the protective cover used as the typing cradle, according to the embodiment of the present invention of FIG. 25.

As illustrated in FIGS. 30 to 33, when the cradling portions 330 are configured so that the protective cover 300 may be used as a typing cradle, the third cradling portion 333 is rotated about the second folding portion 335 to be separated from the inside of the cradling accommodation recess 332a of the second cradling portion 332. The second end 333c of the third cradling portion 333 is caught and supported by the catching portion 311a of the accommodation portion 311, and the first and second cradling portions 331 and 332 are inclined from the inner surface of the accommodation portion 311.

That is, as illustrated in FIG. 33, the first cradling portion 331 is rotated about the hinge portion 331b of the accommodation portion such that the first cradling portion 331 and the second cradling portion 332 are inclined. The second end 333c of the third cradling portion 333 is caught by the catching portion 311a of the accommodation portion 311.

In this state, as illustrated in FIGS. 32 and 33, the first and second cradling portions 331 and 332 are supported on a surface so that the electronic device 1 is laid down. In this state, the user may touch the display unit of the electronic device 1 for typing.

In addition, when the first to third cradling portions 331 to 333 are not configured for use of the protective cover 300 as the standing cradle and typing cradle, the third cradling portion 333 is folded about the second folding portion 335 to be accommodated in the accommodation recess 332a of the second cradling portion 332, and the first cradling portion 331 is rotated reversely about the hinge portion 331b to be accommodated again in the accommodation portion 311 of the front cover 310. The second and third cradling portions 332 and 333 are also accommodated in the accommodation portion 311.

As described above, the present embodiment is configured such that when the first to third cradling portions 331 to 333 are configured to cause the third cradling portion 333 to directly contact and face the rear surface of the front cover 310, the first to third cradling portions 331 to 333 may enable the protective cover 300 to be used as a standing cradle, and when the first to third cradling portions 331 to 333 are configured such that the second end 333c of the third cradling portion 333 is caught and supported by the catching portion 311a of the accommodation portion 311, the first to third cradling portions 331 to 333 may enable the protective cover 300 to be used as a typing cradle. As a result, when the protective cover 300 is used as a cradle, the supporting force may be further enhanced as compared to that obtained by using a magnet. In addition, the protective cover 300 is hardly separated and turned over so that the user may perform typing stably. In addition, since no magnet is required, degradation of performances of a magnetic sensor or an antenna of the electronic device may be prevented.

While the invention has been shown and described with reference to certain embodiments thereof, it will be understood by those skilled in the art that various changes in form and detail may be made therein without departing from the spirit and scope of the present disclosure as defined by the appended claims.

What is claimed is:

1. A protective cover comprising:
 a front cover comprising a first recess and a cradle portion capable of being disposed in the first recess, the cradle portion having a plurality of segments; and
 a rear cover connected with the front cover,
 wherein, when the plurality of segments are configured so that a surface of one of the plurality of segments directly contacts an inner surface of the first recess and surfaces of remaining segments of the plurality of segments are separated from the first recess, the protective cover is used as a viewing stand,
 wherein, when surfaces of each of the plurality of segments are separated from the inner surface of the first recess and an end of the one of the plurality of segments is supported by a catching portion formed in the first recess, the protective cover is used as a typing stand,
 wherein the cradle portion is accommodated in the first recess when the protective cover is not used as the viewing stand or the typing stand, and
 wherein the first recess has a shape and a depth corresponding to a shape and a depth of the cradle portion, such that the cradle portion is flush with a surface of the front cover surrounding the first recess when the cradle portion is accommodated in the first recess.

2. The protective cover of claim 1, wherein the plurality of segments comprises:
 a first segment;
 a second segment provided at a first end of the first segment;
 a third segment provided at a first end of the second segment;
 a first fold line provided between and foldably interconnecting the first segment and second segment; and
 a second fold line provided between and foldably interconnecting the second segment and third segment.

3. The protective cover of claim 2, wherein a second end of the first segment is provided with a hinge portion that allows the first segment to be rotated from the first recess.

4. The protective cover of claim 3, wherein the third segment includes a support surface formed to directly contact and face the inner surface of the first recess and support a triangular configuration of the first segment and the second segment, when the protective cover is used as the viewing stand.

5. The protective cover of claim 4, wherein the third segment includes a first end and a second end, the first end of the third segment being foldably connected to the first end of the second segment, and
 wherein, when the second end of the third segment is caught by the catching portion formed in the first recess, the protective cover is used as a typing stand, and when the second end of the third stand segment is released from the catching portion, the third segment is accommodated in a second recess formed on the second segment.

6. The protective cover of claim 5, wherein:
 when the protective cover is used as the viewing stand, the first segment is rotated about the hinge portion, the third segment is rotated about the second fold line and separated from the second recess, the second segment is rotated about the first fold line, and the support surface of the third segment is positioned to directly contact and face the inner surface of the first recess,
 when the protective cover is used as the typing stand, the third segment is rotated about the second fold line to be separated from the second recess, and the second end of the third segment is caught and supported by the catching portion of the first recess, and
 when the protective cover is not used as the viewing stand or the typing stand, the third segment is folded about the second fold line to be accommodated in the second recess, and the second and third segments are folded about the first fold line and a hinge portion to be accommodated in the first recess.

* * * * *